(12) United States Patent
Han et al.

(10) Patent No.: US 12,046,174 B2
(45) Date of Patent: Jul. 23, 2024

(54) PIXEL CIRCUIT, DISPLAY PANEL, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Linhong Han, Beijing (CN); Qiwei Wang, Beijing (CN); Benlian Wang, Beijing (CN); Tinghua Shang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/772,200

(22) PCT Filed: Mar. 29, 2021

(86) PCT No.: PCT/CN2021/083533
§ 371 (c)(1),
(2) Date: Apr. 27, 2022

(87) PCT Pub. No.: WO2022/204862
PCT Pub. Date: Oct. 6, 2022

(65) Prior Publication Data
US 2024/0144849 A1 May 2, 2024

(51) Int. Cl.
*G09G 3/20* (2006.01)
*H01L 27/12* (2006.01)

(52) U.S. Cl.
CPC ............ *G09G 3/20* (2013.01); *H01L 27/124* (2013.01); *G09G 2300/0408* (2013.01); *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2320/0209* (2013.01)

(58) Field of Classification Search
None
See application file for complete search history.

(56) References Cited

U.S. PATENT DOCUMENTS

| | | | | |
|---|---|---|---|---|
| 11,373,599 | B1* | 6/2022 | Chen | ..................... G09G 3/3233 |
| 2015/0102303 | A1* | 4/2015 | Kim | .................... H10K 59/1213 |
| | | | | 257/40 |
| 2016/0012775 | A1* | 1/2016 | Jeong | ................. H10K 59/1216 |
| | | | | 438/34 |

(Continued)

*Primary Examiner* — Sepehr Azari
(74) *Attorney, Agent, or Firm* — Lippes Mathias LLP

(57) ABSTRACT

Provided is a pixel circuit. The pixel circuit includes a semiconductor layer disposed on a side of a base substrate, wherein the semiconductor layer is configured to form active layers of transistors in the pixel circuit, the active layer including a channel region, and a source region and a drain region disposed on two sides of the channel region; and a first gate metal layer disposed on the side of the base substrate, wherein the first gate metal layer is configured to form gates of the transistors, the gates of the transistors being arranged in sequence along a first direction, and the gate of each of the transistors being partially overlapped with the channel region.

20 Claims, 16 Drawing Sheets

(56) References Cited

U.S. PATENT DOCUMENTS

| | | | |
|---|---|---|---|
| 2016/0125809 A1* | 5/2016 | Hwang | G09G 3/3258 |
| | | | 345/212 |
| 2016/0141350 A1* | 5/2016 | Kim | H10K 59/131 |
| | | | 257/40 |
| 2017/0011685 A1* | 1/2017 | Jeon | H10K 59/126 |
| 2017/0124953 A1* | 5/2017 | Shim | G09G 3/2018 |
| 2018/0144684 A1* | 5/2018 | Jeon | G09G 3/3283 |
| 2018/0151115 A1* | 5/2018 | Tseng | G09G 3/3233 |
| 2018/0212016 A1* | 7/2018 | Choi | G09G 3/3258 |
| 2019/0385523 A1* | 12/2019 | Na | G09G 3/3291 |
| 2020/0295110 A1* | 9/2020 | Lee | H01L 27/1237 |
| 2020/0410926 A1* | 12/2020 | Li | G09G 3/325 |
| 2021/0159284 A1* | 5/2021 | Huang | G09G 3/3225 |
| 2021/0280659 A1* | 9/2021 | Park | G09G 3/3233 |
| 2022/0037437 A1* | 2/2022 | Eom | H10K 59/131 |

\* cited by examiner

PIXEL CIRCUIT, DISPLAY PANEL, AND DISPLAY DEVICE

CROSS-REFERENCE TO RELATED APPLICATION

This application is a 371 of PCT application No. PCT/CN2021/083533, filed on Mar. 29, 2021, and entitled "PIXEL CIRCUIT, DISPLAY PANEL, AND DISPLAY DEVICE", the disclosure of which is incorporated herein by reference in its entirety.

TECHNICAL FIELD

The present disclosure relates to the field of display technologies, and in particular relates to a pixel circuit, a display panel, and a display device.

BACKGROUND

A pixel circuit is generally connected to a light-emitting element, and is configured to drive the light-emitting element to emit light.

In the related art, a pixel circuit at least includes a light emission control transistor, a data writing transistor, and a reset transistor, and the transistors may each be formed of an active layer and a gate metal layer laminated in sequence.

SUMMARY

Embodiments of the present disclosure provide a pixel circuit, a display panel, and a display device. The technical solutions are as follows.

In an aspect, a pixel circuit is provided. The pixel circuit includes:
  a semiconductor layer disposed on a side of a base substrate, wherein the semiconductor layer is configured to form active layers of transistors in the pixel circuit, the active layer including a channel region, and a source region and a drain region disposed on two sides of the channel region; and
  a first gate metal layer disposed on the side of the base substrate, wherein the first gate metal layer is configured to form gates of the transistors, the gates of the transistors being arranged in sequence along a first direction, and the gate of each of the transistors being partially overlapped with the channel region;
  wherein in the transistors, a drain region of a first reset transistor is coupled to a gate of a drive transistor, a drain region of a second reset transistor is coupled to an anode of a light-emitting element, and a drain region of a first light emission control transistor is coupled to the anode of the light-emitting element; and along a second direction, a channel region of the first reset transistor is disposed between a channel region of the first light emission control transistor and a channel region of the second reset transistor, the first direction being perpendicular to the second direction.

Optionally, the channel region of the first reset transistor includes a first channel region and a second channel region opposite to each other;
  wherein the channel region of the first light emission control transistor is close to the first channel region of the first reset transistor, and the channel region of the second reset transistor is close to the second channel region of the first reset transistor.

Optionally, a source region of the first reset transistor and a source region of the second reset transistor are both coupled to a reset signal line; and a gate of the first reset transistor and a gate of the second reset transistor are both coupled to a reset control line; and
  the drain region of the second reset transistor includes a first strip portion and a second strip portion, the channel region of the second reset transistor is strip-shaped, and the source region of the second reset transistor is strip-shaped; wherein one end of the first strip portion is coupled to the anode of the light-emitting element; the other end of the first strip portion, the second strip portion, the channel region of the second reset transistor and one end of the source region of the second reset transistor are sequentially connected; and the other end of the source region of the second reset transistor is coupled to the reset signal line;
  wherein the first strip portion and the second strip portion are not collinear, and/or the second strip portion and the channel region of the second reset transistor are not collinear.

Optionally, an angle between the first strip portion and the second strip portion and an angle between the second strip portion and the channel region of the second reset transistor are both obtuse angles, and both face towards the first reset transistor.

Optionally, the pixel circuit further includes: a source-drain metal layer disposed on the side of the base substrate; wherein
  the source-drain metal layer is configured to form sources and drains of the transistors, wherein in each of the transistors, the source is coupled to the source region, and the drain is coupled to the drain region; and
  the source-drain metal layer is partially overlapped with the drain region of the first reset transistor and/or the channel region of the first reset transistor.

Optionally, the transistors further include a first data compensation transistor and a second data compensation transistor; wherein
  a drain region of the first data compensation transistor is coupled to a drain region of the drive transistor, and a source region of the first data compensation transistor is coupled to the gate of the drive transistor; a drain region of the second data compensation transistor is coupled to a source region of the drive transistor, a source region of the second data compensation transistor is coupled to a data signal line, and a gate of the first data compensation transistor and a gate of the second data compensation transistor are both coupled to a gate signal line;
  wherein the source-drain metal layer includes a first metal pattern and a second metal pattern spaced apart from each other, the first metal pattern being partially overlapped with the drain region of the first reset transistor and/or the channel region of the first reset transistor, and the first reset transistor and the second reset transistor being coupled to a reset signal line through the first metal pattern; and the second metal pattern being partially overlapped with the drain region of the first data compensation transistor.

Optionally, the second metal pattern is further partially overlapped with a channel region of the second data compensation transistor and/or the drain region of the second data compensation transistor.

Optionally, the transistors further include a second light emission control transistor; wherein a gate of the second light emission control transistor and a gate of the first light emission control transistor are both coupled to a light emission control line; a drain region of the second light emission control transistor is coupled to the source region of the drive transistor, and a source region of the second light emission control transistor is coupled to a drive power line; and a source region of the first light emission control transistor is coupled to the drain region of the drive transistor;

wherein the drive power line and the second metal pattern are disposed in a same layer.

Optionally, the source-drain metal layer further includes a third metal pattern and a fourth metal pattern spaced apart from each other;

wherein the drain region of the first reset transistor and the gate of the drive transistor are coupled through the third metal pattern, and the drain region of the first data compensation transistor and the gate of the drive transistor are coupled through the third metal pattern; and the data signal line and the fourth metal pattern are disposed in a same layer.

Optionally, the pixel circuit further includes: a second gate metal layer disposed on the side of the base substrate, wherein the second gate metal layer includes a first metal block, the first metal block being partially overlapped with the drain region of the first reset transistor.

Optionally, the second gate metal layer further includes a second metal block spaced apart from the first metal block;

wherein the second metal block is partially overlapped with the active layer of the first reset transistor, and is partially overlapped with the drain region of the second reset transistor.

Optionally, the reset signal line coupled to the first reset transistor and the second reset transistor is disposed in a same layer as the second metal block.

Optionally, the second metal block includes a first portion extending along the first direction and a second portion extending along the second direction.

Optionally, the second gate metal layer further includes a third metal block spaced apart from the first metal block;

wherein the third metal block is configured to form a first capacitor electrode of a storage capacitor, and the first gate metal layer is further configured to form a second capacitor electrode of the storage capacitor, the first capacitor electrode being partially overlapped with the second capacitor electrode.

Optionally, the third metal block is coupled to a drive power line, and a portion, coupled to the drive power line, of the third metal block is not overlapped with the active layer.

Optionally, the first metal block is further partially overlapped with the drain region of the first data compensation transistor.

Optionally, the first metal block includes a first metal strip, a second metal strip, and a third metal strip connected in sequence; wherein the first metal strip is partially overlapped with the drain region of the first data compensation transistor, the second metal strip is partially overlapped with the drain region of the first reset transistor, and the third metal strip is disposed between a first node and a second node;

wherein the first node is a node at which the gate of the drive transistor is coupled to the drain region of the first reset transistor, and the second node is a node at which the drain region of the second data compensation transistor is coupled to a data signal line.

Optionally, an extending direction of the second metal strip intersects an extending direction of the first metal strip and intersects an extending direction of the third metal strip, and the extending direction of the first metal strip is parallel to the extending direction of the third metal strip.

Optionally, the extending direction of the second metal strip is perpendicular to the extending direction of the first metal strip, and is perpendicular to the extending direction of the third metal strip.

In another aspect, a display panel is provided. The display panel includes: a base substrate, a light-emitting element disposed on a side of the base substrate, and the pixel circuit described in the above aspect;

wherein the pixel circuit is connected to the light-emitting element, and the pixel circuit is configured to drive the light-emitting element to emit light.

Optionally, the pixel circuit further includes a planarization layer disposed on a side, away from the base substrate, of a source-drain metal layer, an anode of the light-emitting element is disposed on a side, away from the base substrate, of the planarization layer, and the anode of the light-emitting element is coupled to the source-drain metal layer in the pixel circuit through a via hole penetrating the planarization layer.

Optionally, in two adjacent pixel circuits in a same row, third metal blocks in second gate metal layers are coupled to each other;

two adjacent pixel circuits in a same column share a same data signal line and a same drive power line; and two adjacent pixel circuits in the same row share a same reset signal line.

In still another aspect, a display device is provided. The display device includes: a power supply assembly, and the display panel described in the above aspect;

wherein the power supply assembly is connected to the display panel, and configured to supply power to the display panel.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, the embodiments of the present disclosure are described in detail hereinafter with reference to the accompanying drawings.

Figure 1:
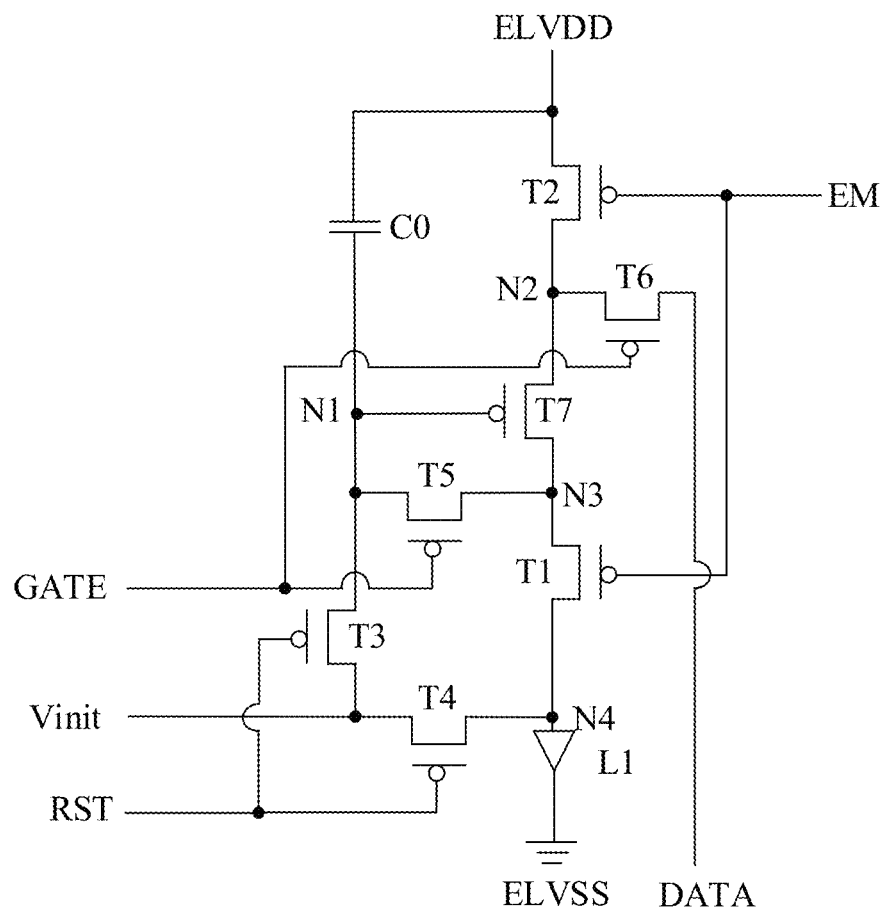
FIG. 1 is a circuit structure diagram of a pixel circuit according to an embodiment of the present disclosure.

FIG. 1 is a circuit structure diagram of a pixel circuit according to an embodiment of the present disclosure. As shown in FIG. 1, the pixel circuit may include a first light emission control transistor T1, a second light emission control transistor T2, a first reset transistor T3, a second reset transistor T4, a first data compensation transistor T5, a second data compensation transistor T6, a drive transistor T7, and a storage capacitor C0.

A first end (also referred to as a first capacitor electrode) of the storage capacitor C0 may be coupled to a drive power line ELVDD, ad a second end (also referred to as a second capacitor electrode) of the storage capacitor C0 may be coupled to a gate (i.e., a first node N1 in the figure) of the drive transistor T7. Coupling may refer to electrical connection.

A gate of the first light emission control transistor T1 and a gate of the second light emission control transistor T2 may both be coupled to a light emission control line EM.

A drain of the first light emission control transistor T1 may be coupled to an anode (i.e., a fourth node N4 in the figure) of the light-emitting element L1, and a source of the first light emission control transistor T1 may be coupled to a drain (i.e., a third node N3 in the figure) of the drive transistor T7. A source of the second light emission control transistor T2 may be coupled to the drive power line ELVDD, and a drain of the second light emission control transistor T2 may be coupled to a source (i.e., a second node N2 in the figure) of the drive transistor T7. The first light emission control transistor T1 may control the conduction/non-conduction between the drain of the drive transistor T7 and the anode of the light-emitting element L1 in response to a light emission control signal provided by the light emission control line EM. The second light emission control transistor T2 may control the conduction/non-conduction between the drive power line ELVDD and the source of the drive transistor T7 in response to the light emission control signal.

A gate of the first reset transistor T3 and a gate of the second reset transistor T4 may both be coupled to a reset control line RST. A source of the first reset transistor T3 and a source of the second reset transistor T4 may both be coupled to a reset signal line Vinit. A drain of the first reset transistor T3 may be coupled to the gate of the drive transistor T7. The source of the second reset transistor T4 may be coupled to the anode of the light-emitting element L1. The first reset transistor T3 may control the conduction/non-conduction between the reset signal line Vinit and the gate of the drive transistor T7 in response to a reset control signal provided by the reset control line RST. The second reset transistor T4 may control the conduction/non-conduction between the reset signal line Vinit and the anode of the light-emitting element L1 in response to the reset control signal.

A gate of the first data compensation transistor T5 and a gate of the second data compensation transistor T6 may both be coupled to a gate drive line GATE. A source of the first data compensation transistor T5 may be coupled to the drain of the drive transistor T7, and a drain of the first data compensation transistor T5 may be coupled to the gate of the drive transistor T7. A source of the second data compensation transistor T6 may be coupled to a data signal line DATA, and a drain of the second data compensation transistor T6 may be coupled to the source of the drive transistor T7. The first data compensation transistor T5 may control the conduction/non-conduction between the drain of the drive transistor T7 and the gate of the drive transistor T7 in response to a gate drive signal provided by the gate drive line GATE. The second data compensation transistor T6 may control the conduction/non-conduction between the data signal line DATA and the source of the drive transistor T7 in response to the gate drive signal.

The drive transistor T7 may transmit a drive current to the third node N3 based on the potential of the first node N1 and the potential of the second node N2. When the second light emission control transistor T2 controls the drain of the drive transistor T7 to be conducted with the anode of the light-emitting element L1, the potential of the third node N3 may be further transmitted to the anode of the light-emitting element L1 through the second light emission control transistor T2, such that the light-emitting element L1 emits light.

Optionally, it may be seen in combination with the structure shown in FIG. 1 that the pixel circuit according to the embodiment of the present disclosure may be a 7T1C structure (i.e., including 7 transistors and 1 capacitor). However, the pixel circuit is not limited to the 7T1C structure, and pixel circuits of other structures may also be applied in the embodiments of the present disclosure on the premise of no conflict. Moreover, in the structure shown in FIG. 1, the transistors are all P-type transistors. Certainly, the transistors may also be N-type transistors. Alternatively, some transistors are N-type transistors and some transistors are P-type transistors.

Figure 2:
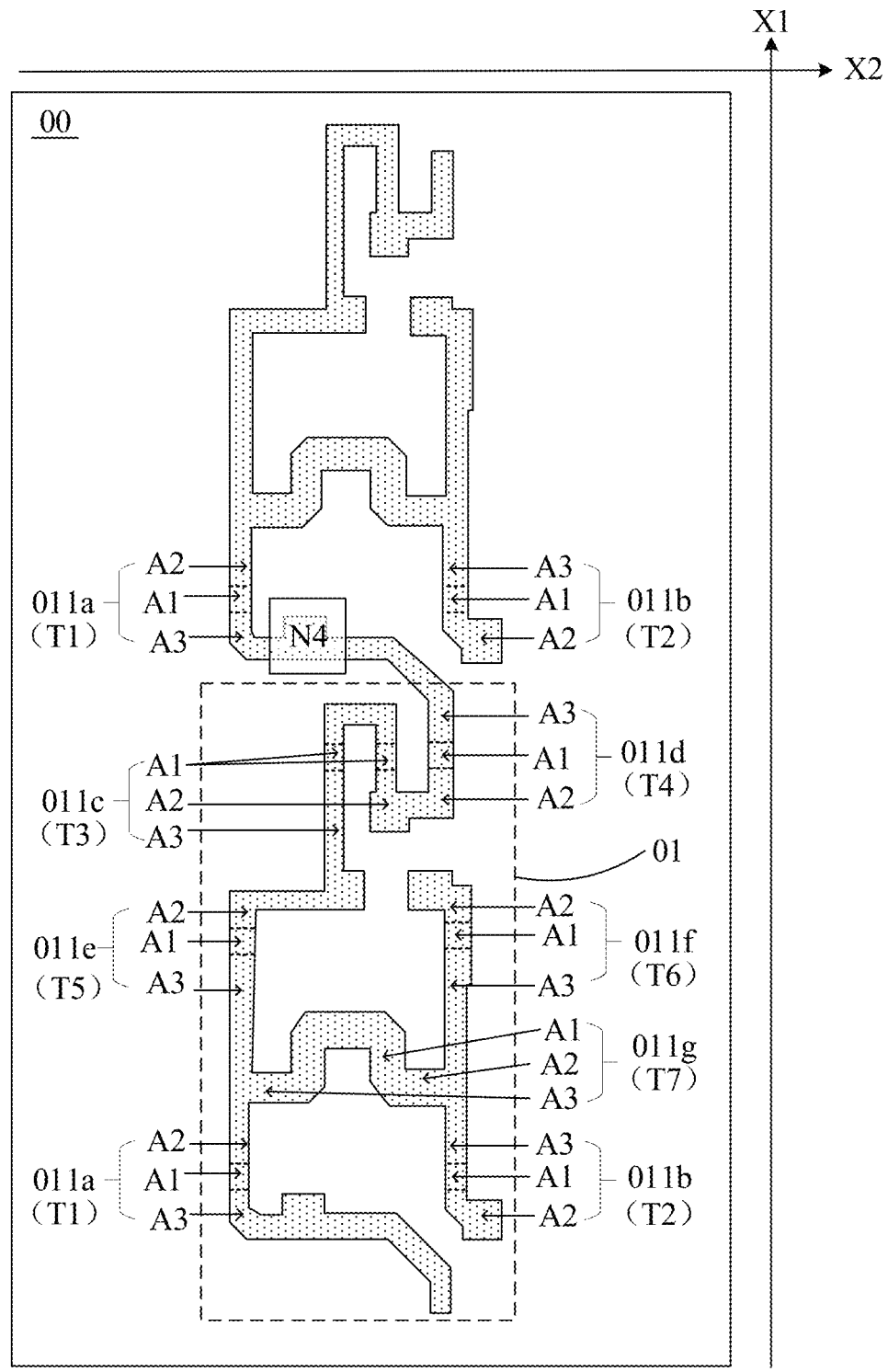
FIG. 2 is a schematic structural diagram of a semiconductor layer in a pixel circuit according to an embodiment of the present disclosure.

Taking the structure of the pixel circuit shown in FIG. 1 as an example, FIG. 2 shows a schematic structural diagram of another pixel circuit. As shown in FIG. 2, the pixel circuit may include a semiconductor layer 01 disposed on a side of a base substrate 00. The semiconductor layer 01 may be intended to form active layers of transistors in the pixel circuit.

In order to distinguish the active layers of different transistors, with reference to FIG. 2, the active layer of the first light emission control transistor T1 may be marked as 011a, the active layer of the second light emission control transistor T2 may be marked as 011b, the active layer of the first reset transistor T3 may be marked as 011c, the active layer of the second reset transistor T4 may be marked as 011d, the active layer of the first data compensation transistor T5 may be marked as 011e, the active layer of the second data compensation transistor T6 may be marked as 011f, and the active layer of the drive transistor T7 may be marked as 011g. In addition, it may be seen with reference to FIG. 2, an orthographic projection of the active layer formed of the semiconductor layer 01 on the base substrate 00 is curved. The same applies to the drawings involved in the following embodiments.

With continued reference to FIG. 2, it may be seen that the active layer of each transistor may include a channel region A1 as well as a source region A2 and a drain region A3 which are on two sides of the channel region A1. The channel region A1 may not be doped, or may be doped in different manner from the source region A2 and the drain region A3, and thus has semiconductor properties. The source region A2 and the drain region A3 may both be doped and thus have conductivity. The doping impurities may vary according to the type of the transistor (i.e., N-type or P-type). In addition, for each transistor, its source may be coupled to the source region A2, and its drain may be coupled to the drain region A3.

Figure 3:
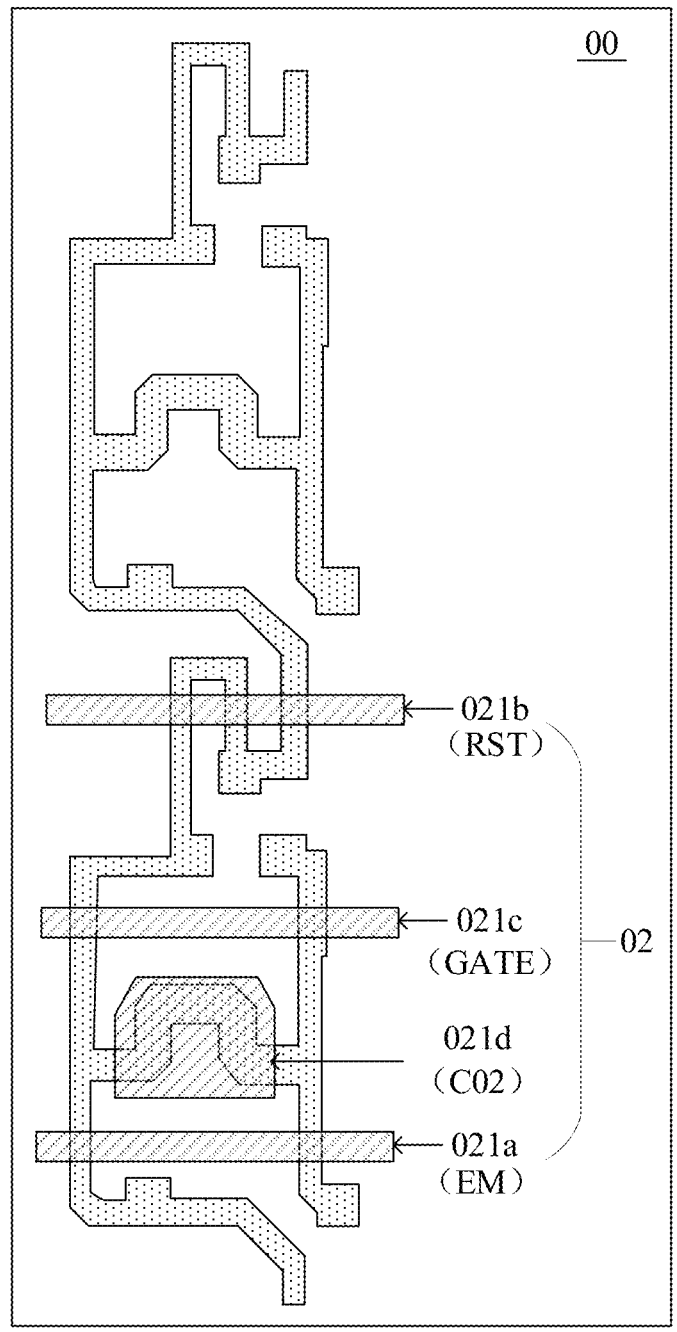
FIG. 3 is a schematic structural diagram of a semiconductor layer and a first gate metal layer in a pixel circuit according to an embodiment of the present disclosure.

FIG. 3 is a schematic structural diagram of another pixel circuit according to an embodiment of the present disclosure. As shown in FIG. 3, the pixel circuit may further include a first gate metal layer 02 disposed on a side of the base substrate 00. The first gate metal layer 02 may be configured to form gates of the transistors.

In order to distinguish the gates of different transistors, with reference to FIG. 3, in the following embodiments, the gate of the first light emission control transistor T1 and the gate of the second light emission control transistor T2 may both be marked as 021a, the gate of the first reset transistor T3 and the gate of the second reset transistor T4 may both be marked as 021b, the gate of the first data compensation transistor T5 and the gate of the second data compensation transistor T6 may both be marked as 021c, and the gate of the drive transistor T7 may be marked as 021d. The same applies to the drawings involved in the following embodiments.

It may be seen in combination with FIGS. 2 and 3 that, for each transistor, its gate may have an overlapping region with its channel region A1. That is, the orthographic projection of the gate 021 on the base substrate 00 is at least partially overlapped with the orthographic projection of the channel region A1 on the base substrate 00. The gates of the transistors may be sequentially arranged along a first direction X1.

It should be noted that, with reference to FIG. 1, the gate 021a of the light emission control transistor may be configured to receive the light emission control signal, that is, the gate 021a of the light emission control transistor may be the light emission control line EM. The gate 021b of the reset transistor may be configured to receive the reset control signal, that is, the gate 021b of the reset transistor may be the reset control line RST. The gate 021c of the data compensation transistor may be configured to receive the gate drive signal, that is, the gate 021c of the data compensation transistor may be the gate drive line GATE.

Optionally, it may be seen in combination with FIGS. 1 and 3 that, the drain region A3 of the first reset transistor T3 described in the embodiments of the present disclosure may be coupled to the gate 021d of the drive transistor T7. For example, the drain region A3 of the first reset transistor T3 may be coupled to the first node N1, and the gate 021d of the drive transistor T7 may be coupled to the first node N1 through a connection portion Bl, such that the drain region A3 of the first reset transistor T3 is reliably coupled to the gate 021d of the drive transistor T7. The drain region A3 of the second reset transistor T4 described in the embodiments of the present disclosure may be coupled to the anode (i.e., the fourth node N4) of the light-emitting element L1. That is, the first reset transistor T3 is a reset transistor for resetting the gate 021d of the drive transistor T7, and the second reset transistor T4 is a reset transistor for resetting the anode of the light-emitting element L1. The drain region A3 of the first light emission control transistor T1 described in the embodiments of the present disclosure may be coupled to the anode of the light-emitting element L1.

In addition, it may be seen with continued reference to FIG. 2 that, in the embodiments of the present disclosure, along a second direction X2, the channel region A1 of the first reset transistor T3 may be disposed between the channel region A1 of the first light emission control transistor T1 and the channel region A1 of the second reset transistor T4. The first direction X1 and the second direction X2 may be perpendicular to each other. For example, the first direction may be a row direction, and the second direction may be a column direction. In this way, it may be determined with reference to the drawings that the second reset transistor T4 for resetting the anode of the light-emitting element L1 described in the embodiments of the present disclosure has a relatively long distance from the anode of the light-emitting element L1. Compared with the related art in which the distance between the second reset transistor T4 and the anode of the light-emitting element L1 is relatively short, the arrangement in the present disclosure can effectively extend the distance between the second reset transistor T4 and the anode of the light-emitting element L1 (i.e., the fourth node N4), such that the leakage current path of the second reset transistor T4 may be extended accordingly, and the leakage current of the second reset transistor T4 is small.

Optionally, on the basis of the related art, mirror processing may be performed such that the distance between the channel region A1 of the second reset transistor T4 and the anode of the light-emitting element L1 is greater than the distance between the channel region A1 of the first reset transistor T3 and the anode of the light-emitting element L1. In order to show the distance between the channel region A1 of the second reset transistor T4 and the anode of the light-emitting element L1, FIGS. 2 and 3 both show the structures of two pixel circuits disposed in the same column.

In summary, the embodiment of the present disclosure provides a pixel circuit. The semiconductor layer in the pixel circuit can form active layers of transistors, and the first gate metal layer in the pixel circuit can form gates of the transistors. The transistors include a first reset transistor for resetting the gate of the drive transistor, a second reset transistor for resetting the anode of the light-emitting element, and a first light emission control transistor coupled to the anode of the light-emitting element. In addition, the channel region of the first reset transistor is disposed between the channel region of the first light emission control transistor and the channel region of the second reset transistor. Accordingly, the distance between the second reset transistor and the anode of the light-emitting element is relatively long, such that the leakage path of the second reset transistor may be relatively long, and the leakage current may be relatively small. Therefore, the potential of the anode of the light-emitting element may be relatively stable, and the light-emitting effect of the light-emitting element is better, which can ensure a good display effect of the display panel.

Figure 4:
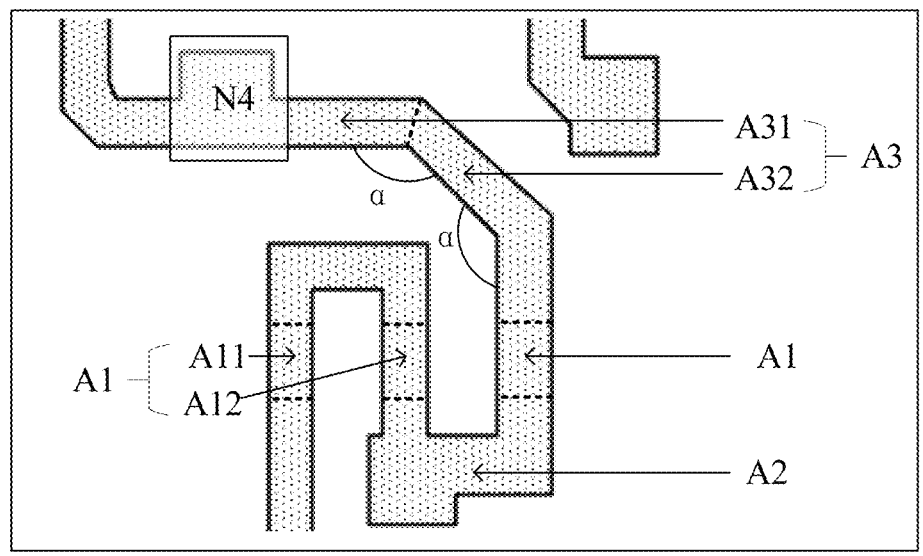
FIG. 4 is a partially enlarged schematic diagram of a pixel circuit according to an embodiment of the present disclosure.

Optionally, FIG. 4 is a partially enlarged schematic diagram of a pixel circuit according to an embodiment of the present disclosure. It may be seen in combination with FIGS. 2 and 4 that the channel region A1 of the first reset transistor T3 described in the embodiments of the present disclosure may include a first channel region A11 and a second channel region A12 that are oppositely arranged along the second direction X2. In other words, the first reset transistor T3 may be a double-gate transistor.

The channel region A1 of the first light emission control transistor T1 may be close to the first channel region A11 of the first reset transistor T3, and the channel region A1 of the second reset transistor T4 may be close to the second channel region A12 of the first reset transistor T3.

With continued reference to FIGS. 2 and 4, it may be seen that the drain region A3 of the second reset transistor T4 described in the embodiments of the present disclosure may include a first strip portion A31 and a second strip portion A32, the channel region A1 of the second reset transistor T4 may be strip-shaped, and the source region A2 of the second reset transistor T4 may be strip-shaped.

One end of the first strip portion A31 may be coupled to the anode (i.e., the fourth node N4) of the light-emitting element L1, and the other end of the first strip portion A31, the second strip portion A32, the channel region A1 of the second reset transistor T4, and one end of the source region A2 of the second reset transistor T4 may be sequentially connected, and the other end of the source region A2 of the second reset transistor T4 may be coupled to the reset signal line Vinit (not shown in FIG. 4).

The first strip portion A31 and the second strip portion A32 may not be collinear, and/or the second strip portion A32 and the channel region A1 of the second reset transistor T4 may not be collinear.

For example, as may be seen with reference to the structure shown in FIG. 4, in the pixel circuit as shown, the extending direction of the first strip portion A31 of the second reset transistor T4 is parallel to the extending direction of the source region A2 of the second reset transistor. The extending direction of the source region A2 of the second reset transistor T4 is perpendicular to the extending direction of the channel region A1 of the second reset transistor T4. Moreover, the angle α between the first strip portion A31 and the second strip portion A32 and the angle α between the second strip portion A32 and the channel region A1 of the second reset transistor T4 are both obtuse angles. The included angle α refers to an angle facing towards the first reset transistor T3.

It may be further determined with reference to the structure shown in FIG. 4 that, in the embodiments of the present disclosure, the length of the portion, coupled to the anode of the light-emitting element L1, of the active layer 011d of the second reset transistor T4 is relatively long. Accordingly, compared with the related art, the leakage path of the second reset transistor T4 is relatively long and the leakage current is relatively small.

Figure 5:
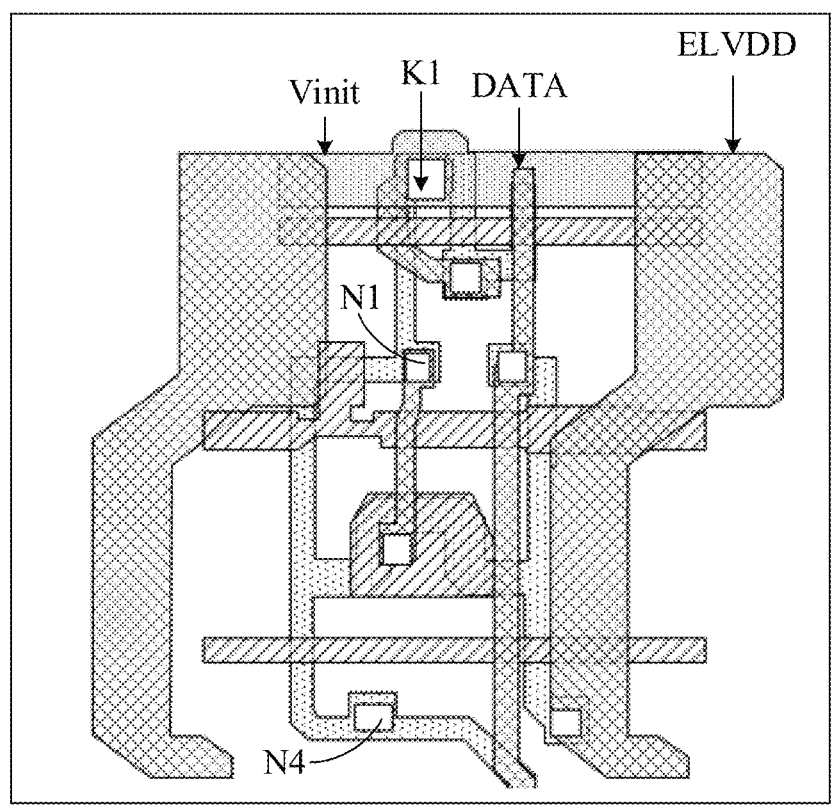
FIG. 5 is a schematic structural diagram of a pixel circuit according to an embodiment of the present disclosure.

Optionally, FIG. 5 is a schematic structural diagram of still another pixel circuit according to an embodiment of the present disclosure. It may be seen in combination with FIGS. 1 to 5 that, in the embodiments of the present disclosure, the gate 021a of the first light emission control transistor T1 and the gate 021a of the second light emission control transistor T2 may both be coupled to the light emission control line EM. The drain region A3 of the second light emission control transistor T2 may be coupled to the source region A2 (i.e., the second node N2) of the drive transistor T7. The source region A2 of the second light emission control transistor T2 may be coupled to the drive power line ELVDD. The source region A2 of the first light emission control transistor T1 may be coupled to the drain region A3 (i.e., the third node N3) of the drive transistor T7.

The gate 021b of the first reset transistor T3 and the gate 021b of the second reset transistor T4 may both be coupled to the reset control line RST. The source region A2 of the first reset transistor T3 and the source region A2 of the second reset transistor T4 may both be coupled to the reset signal line Vinit. The drain region A3 of the first reset transistor T3 may be coupled to the gate 021d (i.e., the first node N1) of the drive transistor T7, and the drain region A3 of the second reset transistor T4 may be coupled to the anode (i.e., the fourth node N4) of the light-emitting element L1.

The gate 021 of the first data compensation transistor T5 and the gate 021 of the second data compensation transistor T6 may both be coupled to the gate drive line GATE. The drain region A3 of the first data compensation transistor T5 may be coupled to the drain region A3 of the drive transistor T7, and the source region A2 of the first data compensation transistor T5 may be coupled to the gate 021 (i.e., the first node N1) of the drive transistor T7. The drain region A3 of the second data compensation transistor T6 may be coupled to the source region A2 (i.e., the second node N2) of the drive transistor T7, and the source region A2 of the second data compensation transistor T6 may be coupled to the data signal line DATA.

As may be seen with reference to FIG. 5, the pixel circuit may further be provided with a plurality of via holes K1, and each via K1 may extend and penetrate through two portions which are in different layers and coupled to each other, such that the two portions may be reliably coupled. For example, the drain region A3 of the second light emission control transistor T2 and the drain region A3 of the second reset transistor T4 may be coupled to the anode (i.e., the fourth node N4) of the light-emitting element L1 through the same via hole K1. Other via holes K1 are respectively described in the following embodiments.

Figure 6:
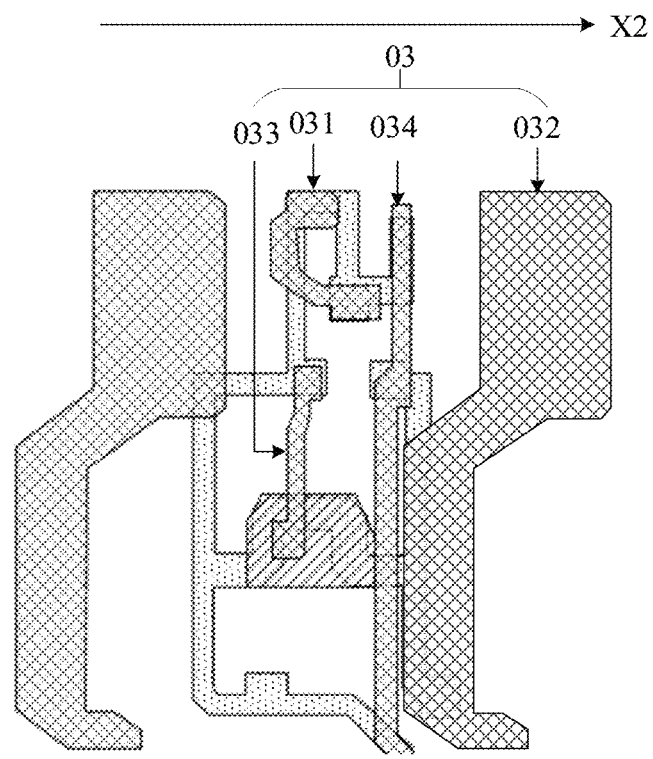
FIG. 6 is a schematic structural diagram of a semiconductor layer, a first gate metal layer, and a source-drain metal layer in a pixel circuit according to an embodiment of the present disclosure.

FIG. 6 is a schematic structural diagram of yet another pixel circuit according to an embodiment of the present disclosure. As shown in FIG. 6, the pixel circuit may further include a source-drain metal layer 03 disposed on a side of the base substrate 00. The source-drain metal layer 03 may be configured to form sources and drains of the transistors. For each transistor, its source may be coupled to the source region A2 of the active layer, and its drain may be coupled to the drain region A3 of the active layer.

Optionally, as may be seen in combination with FIGS. 5 and 6, the source-drain metal layer 03 may include a first metal pattern 031 and a second metal pattern 032 spaced apart from each other. Being spaced apart may refer to being independent of each other and being not in contact.

The first metal pattern 031 may be partially overlapped with the drain region A3 of the first reset transistor T3 and/or the channel region of the first reset transistor T3. The first reset transistor T3 and the second reset transistor T4 may be coupled to the reset signal line Vinit through the first metal pattern 031.

For example, as may be seen in combination with FIGS. 4 to 6, the first metal pattern 031 shown is partially overlapped with the first channel region A11 of the first reset transistor T3, the drain region A3 of the first reset transistor T3, and the connected portion between the first channel region A11 and the second channel region A12 of the first reset transistor T3. The source region A2 of the first reset transistor T3 and the source region A2 of the second reset transistor T4 are both coupled to one end of the first metal pattern 031 through the same via hole K1. The first reset transistor T3 is coupled to the reset signal line Vinit through another via hole K1. In other words, the source region A2 of the first reset transistor T3 and the source region A2 of the second reset transistor T4 may be effectively coupled to the reset signal line Vinit through two via holes K1 in total. In addition, as may also be seen in combination with FIGS. 5 and 6, in order to ensure the above effective coupling, the first metal pattern 031 may cross the reset control line RST.

Optionally, with reference to FIGS. 5 and 6, in the embodiments of the present disclosure, the portion, overlapped with the drain region A3 of the first reset transistor T3, of the first metal pattern 031 may also be a portion of the drain region A3 close to the gate 021d of the drive transistor T7, i.e., close to the first node N1. In this way, the potential of the gate 021d of the drive transistor T7 may be effectively stabilized by the first metal pattern 031.

Optionally, the second metal pattern 032 may be partially overlapped with the drain region A3 of the first data compensation transistor T5, may be partially overlapped with the channel region A1 of the second data compensation transistor T6 and/or the drain region A2 of the second data compensation transistor T6, and may further be partially overlapped with the active layer 011b of the second light emission control transistor T2.

For example, as shown in FIG. 6, the second metal pattern 032 is overlapped with the drain region A3 of the first data compensation transistor T5, the channel region A1 of the second data compensation transistor T6, the drain region A2 of the second data compensation transistor T6, and the active layer 011b of the second light emission control transistor T2.

Optionally, the drive power line ELVDD described in the above embodiments may be disposed in the same layer as the second metal pattern 032. In other words, the second metal pattern 032 may be the drive power line ELVDD for receiving the drive power signal. Furthermore, it may be seen in combination with FIG. 5 that the second light emission control transistor T2 and the drive power line ELVDD (i.e., the second metal pattern 032) may be coupled through one via hole K1.

Being disposed in the same layer may refer to that a film layer for forming a specific pattern is formed through the same film forming process, and then a layer structure is formed by patterning the film layer by using a mask through one-time patterning process. For different specific patterns, the one-time patterning process may include multiple exposure, development or etching processes, and the specific pattern in the formed layer structure may be continuous or discontinuous. That is, the plurality of elements, components, structures and/or portions disposed in the same layer are made from the same material through the same patterning process.

Similarly, with reference to FIGS. 5 and 6, in the embodiments of the present disclosure, the portion, overlapped with the drain region A3 of the first data compensation transistor T5, of the second metal pattern 032 may also be a portion of the drain region A3 of the first data compensation transistor T5 which is close to the gate 021d of the drive transistor T7, i.e., close to the first node N1. In this way, the potential of the gate 021d of the drive transistor T7 may be effectively stabilized by the second metal pattern 032.

Optionally, it may be seen in combination with FIGS. 5 and 6 that the source-drain metal layer 03 may further include a third metal pattern 033 and a fourth metal pattern 034 spaced apart from each other.

The drain region A3 of the first reset transistor T3 and the gate 021d of the drive transistor T7 may both be coupled by the third metal pattern 033, and the drain region A3 of the first data compensation transistor T5 and the gate 021d of the drive transistor T7 may also be coupled by the third metal pattern 033.

For example, as shown in FIG. 6, the drain region A3 of the first reset transistor T3 and the drain region A3 of the first data compensation transistor T5 may both be coupled to one end of the third metal pattern 033 through the same via hole K1. The gate 021d of the drive transistor T7 may be coupled to the other end of the third metal pattern 033 through one via hole K1. In this way, the drain region A3 of the first reset transistor T3 and the gate 021d of the drive transistor T7 may be effectively coupled with each other, and the drain region A3 of the first data compensation transistor T5 and the gate 021d of the drive transistor T7 may be effectively coupled with each other. In addition, it may also be seen in combination with FIGS. 5 and 6 that the third metal pattern 033 may cross the gate drive line GATE.

The data signal line DATA described in the above embodiments may be disposed in the same layer as the fourth metal pattern 034. That is, the fourth metal pattern 034 may be the data signal line DATA. In this way, it may be seen in combination with FIG. 5 that the second data compensation transistor T6 may be effectively coupled to the fourth metal pattern 034 through one via hole K1. In addition, it may also be seen in combination with FIG. 6 that the fourth metal pattern 034 crosses the light emission control line EM, the gate drive line GATE, and the reset control line RST, and is overlapped with the active layer 0ild of the second reset transistor T4, the active layer 011g of the drive transistor T7, and the active layer 011b of the second light emission control transistor T2.

Optionally, as may be seen in combination with FIGS. 5 and 6, in the embodiments of the present disclosure, on one hand, in order to ensure an effective overlapping among the above layers, compared with other metal patterns, the second metal pattern 032 disposed in the same layer as the drive power line ELVDD is relatively wide, that is, the drive power line ELVDD may be relatively wide. On the other hand, in the fourth metal pattern 034 disposed in the same layer as the data signal line DATA, the shape and area of the portion, overlapped with the active layer 011d of the second reset transistor T4, of the fourth metal pattern 034 matches the shape and size of the active layer 011d, which can reduce the non-light-transmitting area at the location of the second reset transistor T4 and improve the light transmittance. On still another hand, the orthographic projections of the drive power line ELVDD and the data signal line DATA on the base substrate 00 may both be of bent shapes. The bent shapes may match with each other, and may be respectively disposed at two sides of the first reset transistor T3 along the second direction X2.

It should be noted that, the via holes K1 provided for coupling described in the embodiments of the present disclosure may all be disposed in the same layer as the source-drain metal layer 03.

Figure 7:
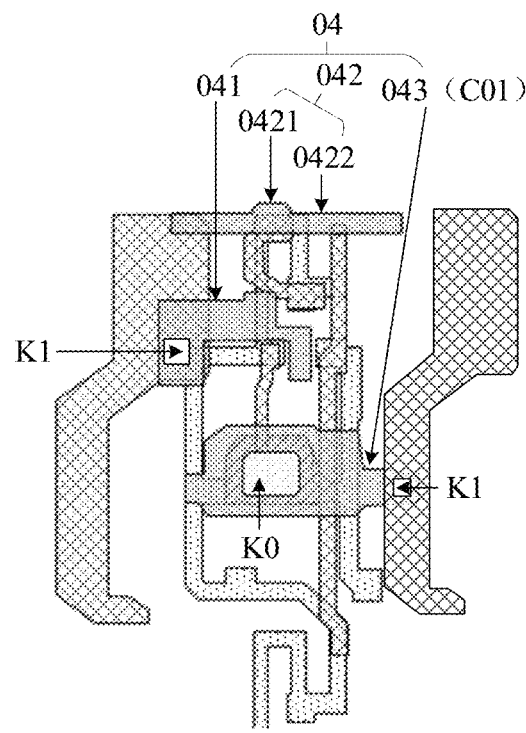
FIG. 7 is a schematic structural diagram of a semiconductor layer, a first gate metal layer, a source-drain metal layer, and a second gate metal layer in a pixel circuit according to an embodiment of the present disclosure.

Optionally, FIG. 7 is a schematic structural diagram of still another pixel circuit according to an embodiment of the present disclosure. As shown in FIG. 7, the pixel circuit may further include a second gate metal layer 04 disposed on a side of the base substrate 00. The second gate metal layer 04 may include a first metal block 041.

The first metal block 041 may be partially overlapped with the drain region A3 of the first reset transistor T3, and may also be partially overlapped with the drain region A3 of the first data compensation transistor T5.

For example, as shown in FIG. 7, the first metal block 041 is overlapped with the drain region A3 of the first reset transistor T3 and the drain region A3 of the first data compensation transistor T5, but is not overlapped with the gate 021b of the first reset transistor T3 and the gate of the first data compensation transistor T5.

In addition, as may be seen in combination with FIG. 5, the first metal block 041 shown in FIG. 7 may cover the portion, close to the first node N1, of the active layer 011c of the first reset transistor T3, and may cover the portion, close to the first node N1, of the active layer 011e of the first data compensation transistor T5. In this way, the potential of the first node N1 can be effectively stabilized.

Optionally, as may be seen in combination with FIGS. 5 and 7, the first metal block 041 described in the above embodiments may also be partially overlapped with the drive power line ELVDD, and the first metal block 041 is coupled with the drive power line ELVDD through the via hole K1. That is, in the embodiments of the present disclosure, the potential of the first node N1 may be stabilized by the power signal provided by the drive power line ELVDD.

Figure 8:
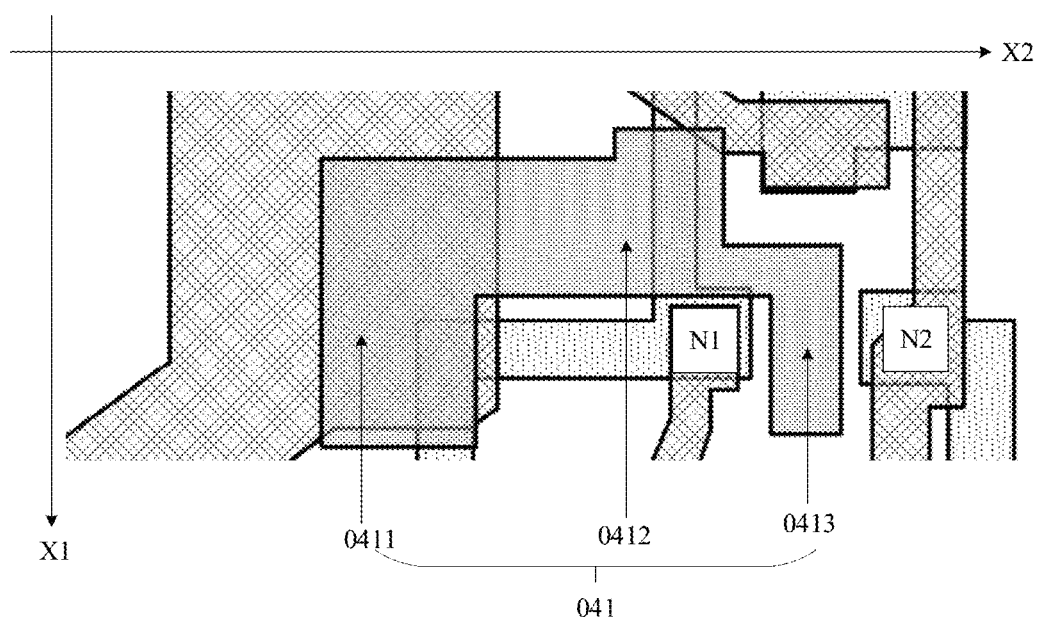
FIG. 8 is a partially enlarged view of a pixel circuit according to an embodiment of the present disclosure.

Optionally, FIG. 8 is a partially enlarged schematic diagram of a pixel circuit according to an embodiment of the present disclosure. As may be seen with reference to FIG. 8, the first metal block 041 may include a first metal strip 0411, a second metal strip 0412, and a third metal strip 0413 connected in sequence.

As may be seen in combination with FIGS. 1 to 8, the first metal strip 0411 may be partially overlapped with the drain region A3 of the first data compensation transistor T5, the second metal strip 0412 may be overlapped with the drain region A3 of the first reset transistor T3, and the third metal strip 0413 may be disposed between the first node N1 and the second node N2. That is, the third metal strip 0413 may be sandwiched between the first node N1 and the second node N2 without being in contact with either node.

The first node N1 may be a node at which the gate 021d of the drive transistor T7 is coupled to the drain region A3 of the first reset transistor T3, and the second node N2 may be a node at which the drain region A3 of the second data compensation transistor T6 is coupled to the data signal line DATA.

By setting the first metal block 041 to further include the third metal strip 0413 disposed between the first node N1 and the second node N2, the spatial capacitance between the first node N1 and the data signal line DATA coupled to the second node N2 can be reduced to alleviate the phenomenon of voltage crosstalk.

Optionally, in the embodiments of the present disclosure, the extending direction of the second metal strip 0412 may intersect the extending direction of the first metal strip 0411, and may intersect the extending direction of the third metal strip 0413. The extending direction of the first metal strip 0411 may be parallel to the extending direction of the third metal strip 0413. For example, as may be seen with reference to the structure shown in FIG. 8, the extending direction of the second metal strip 0412 is perpendicular to the extending direction of the first metal strip 0411 and perpendicular to the extending direction of the third metal strip 0413.

Optionally, as may be seen with continued reference to FIG. 7, the second gate metal layer 04 may further include a second metal block 042 spaced apart from the first metal block 041. The second metal block 042 may be partially overlapped with the active layer 011c of the first reset transistor T3, and may also be partially overlapped with the drain region A3 of the second reset transistor T4.

For example, in the structure shown in FIG. 7, the second metal block 042 is overlapped with the connected portion between the two channel regions A11 and A12 of the first reset transistor T3, and is partially overlaps the source region A3 of the second reset transistor T4. In addition, the second metal block 042 is not overlapped with the gate 021b of the reset transistor.

Optionally, in the embodiments of the present disclosure, the reset signal line Vinit may be disposed in the same layer as the second metal block 042. That is, the second metal block 042 may be the reset signal line Vinit for receiving the reset signal.

Optionally, as may be seen in combination with FIGS. 7 and 8, in the embodiment of the present disclosure, the second metal block 042 may have a first portion 0421 extending along the first direction X1 and a second portion 0422 extending along the second direction X2. That is, the reset signal line Vinit may be set to include a longitudinal trance extending along the column direction, to reduce the loading on the reset signal line Vinit. Thus, the leakage current of the second reset transistor T4 is further reduced, and the reset effect is optimized.

Optionally, as may be seen with continued reference to FIG. 7, the second gate metal layer 04 may further include a third metal block 043. The third metal block 043 is spaced apart from both the first metal block 041 and the second metal block 042.

The third metal block 043 may be configured to form the first capacitor electrode C01 of the storage capacitor C0. It should be noted that, in the embodiments of the present disclosure, the first gate metal layer 02 may further be configured to form the second capacitor electrode C02 of the storage capacitor C0. The first capacitor electrode C01 and the second capacitor electrode C02 may be partially overlapped, and the overlapping portion may form the storage capacitor C0.

In addition, as may be seen in combination with FIGS. 1 and 7, the third metal block 043 further needs to be coupled to the drive power line ELVDD through the via hole K1. Moreover, in the embodiments of the present disclosure, the portion, coupled to the drive power line ELVDD, of the third metal block 043 may be not overlapped with the semiconductor layer 01, so as to avoid signal crosstalk.

Optionally, as may be seen in combination with FIGS. 3 and 7, the first capacitor electrode C01 (i.e., the third metal block 043) may include a through hole K0. The through hole K0 may facilitate a reliable coupling between the second capacitor electrode C02 under the first capacitor electrode C01 and the third metal pattern 033. In addition, an orthographic projection of the through hole K0 on the base substrate 00 may be of a substantially rectangular shape. Here, the "substantially rectangular shape" may include a rectangle or a square, or a rectangle or square with at least one rounded corner, or a rectangle or square with at least one chamfered corner, or the like. An orthographic projection of the second capacitor electrode C02 on the base substrate 00 may also be of a substantially rectangular shape.

Optionally, an insulating layer may be disposed between every two adjacent metal layers. For example, an insulating layer may be disposed between the anode of the light-emitting element L1 and the source-drain metal layer 03, and another insulating layer may be disposed between the second gate metal layer 04 and the source-drain metal layer 03. Moreover, the insulating layer disposed between the second gate metal layer 04 and the source-drain metal layer 03 may be an inter-layer dielectric (ILD) layer, and the insulating layer disposed between the light-emitting element L1 and the source-drain metal layer 03 may be a planarization (PLN) layer.

Optionally, in the embodiments of the present disclosure, the semiconductor layer 01 may be made of a semiconductor material such as low temperature polysilicon, and its film thickness may be in the range of 400-800 angstroms, for example, 500 angstroms. The first gate metal layer 02 and the second gate metal layer 04 may be made of a conductive material such as molybdenum (Mo), and the film thicknesses may be in the range of 2000-4000 angstroms, for example, 3000 angstroms. The source-drain metal layer 03 may be made of a conductive material such as titanium (Ti) and aluminum (Al). For example, the source-drain metal layer 03 may be of a laminated structure made of Ti, Al and Ti in sequence, and its film thickness may be in the range of 6000-9000 angstroms The insulating layers such as the inter-layer dielectric layer and the planarization layer may be made of an insulating material such as silicon oxide, silicon nitride or silicon oxynitride, and each layer may have a thickness of about 1000-2000 angstroms.

Figure 9:
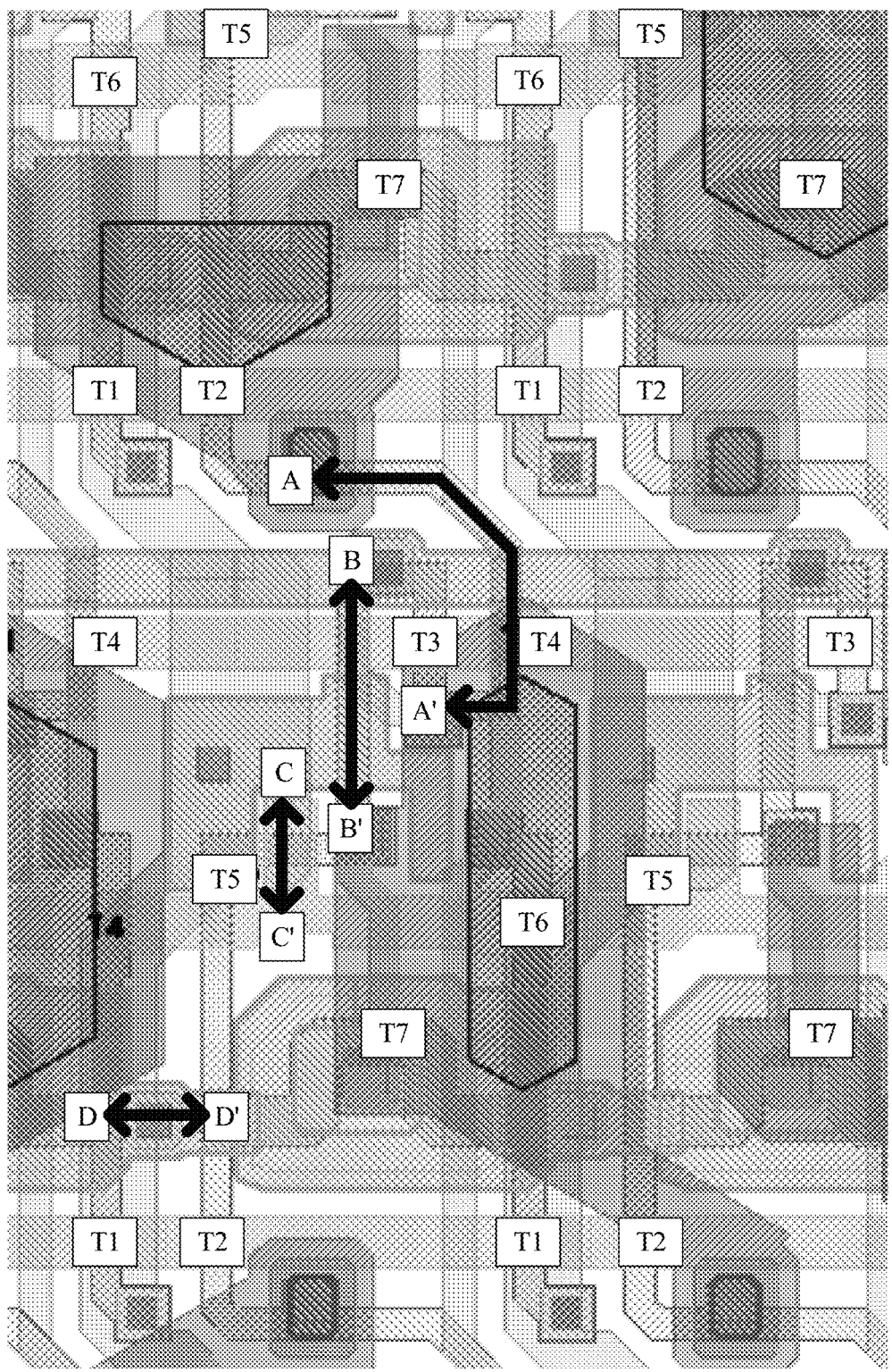
FIG. 9 is a schematic diagram of a complete structure of a pixel circuit according to an embodiment of the present disclosure.
Figure 10:
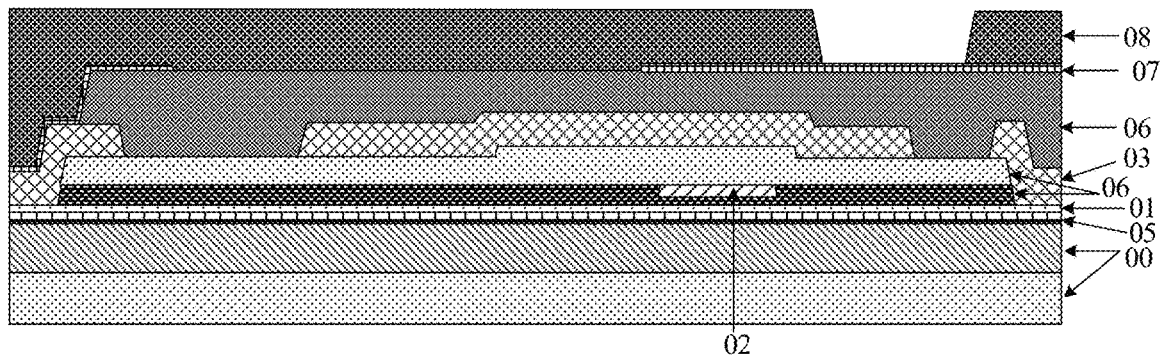
FIG. 10 is a sectional view in the direction of AA' in the structural diagram shown in FIG. 9.
Figure 11:
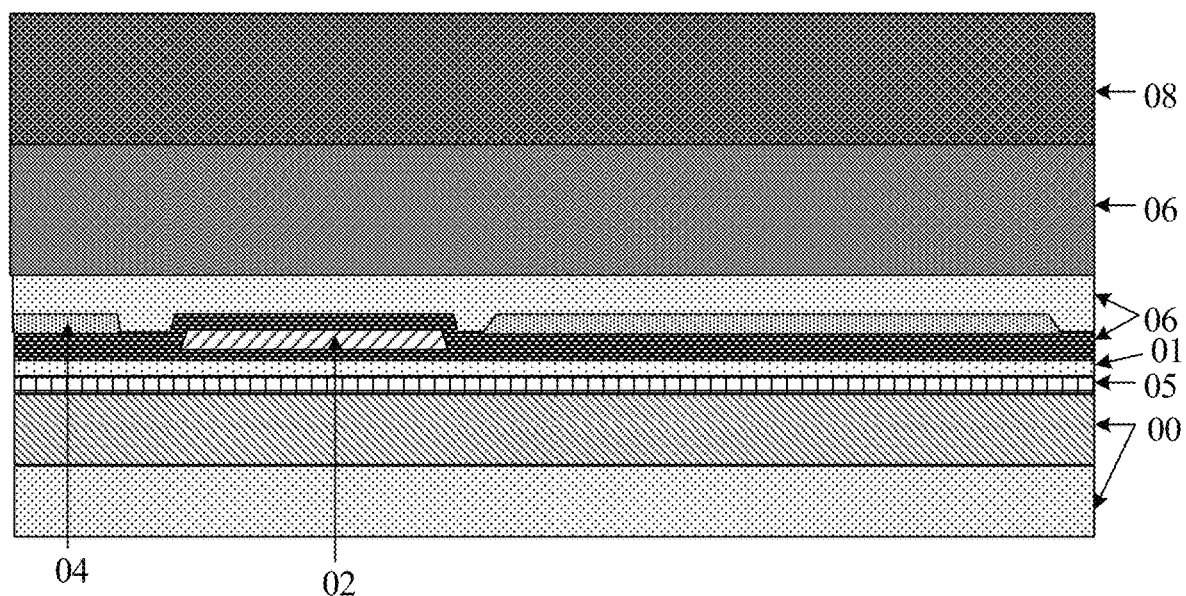
FIG. 11 is a sectional view in the direction of BB' in the structural diagram shown in FIG. 9.
Figure 12:
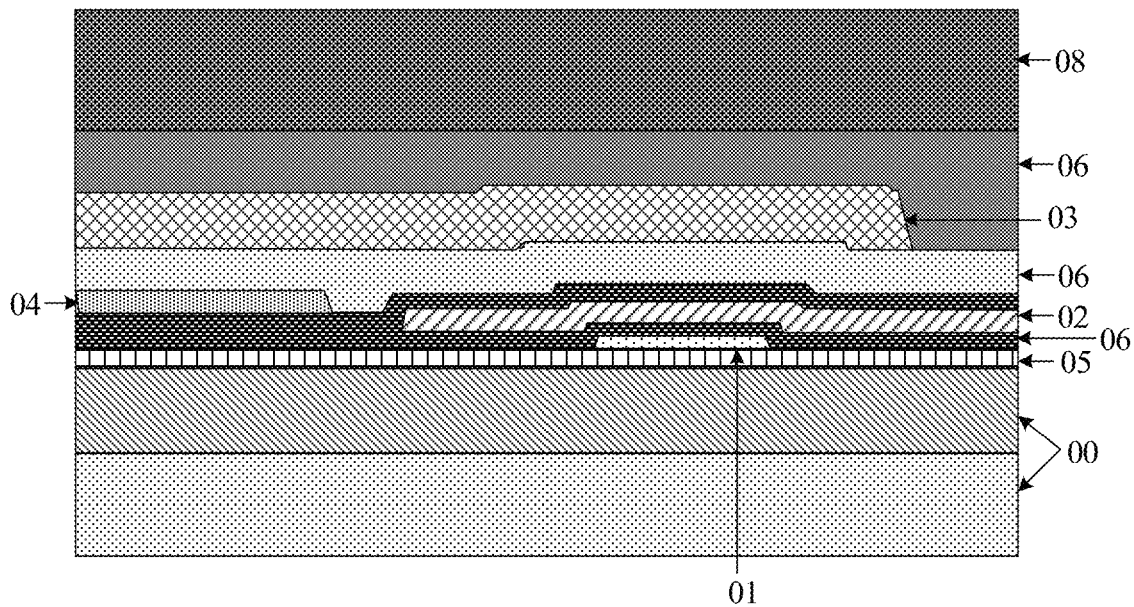
FIG. 12 is a sectional view in the direction of CC' in the structural diagram shown in FIG. 9.
Figure 13:
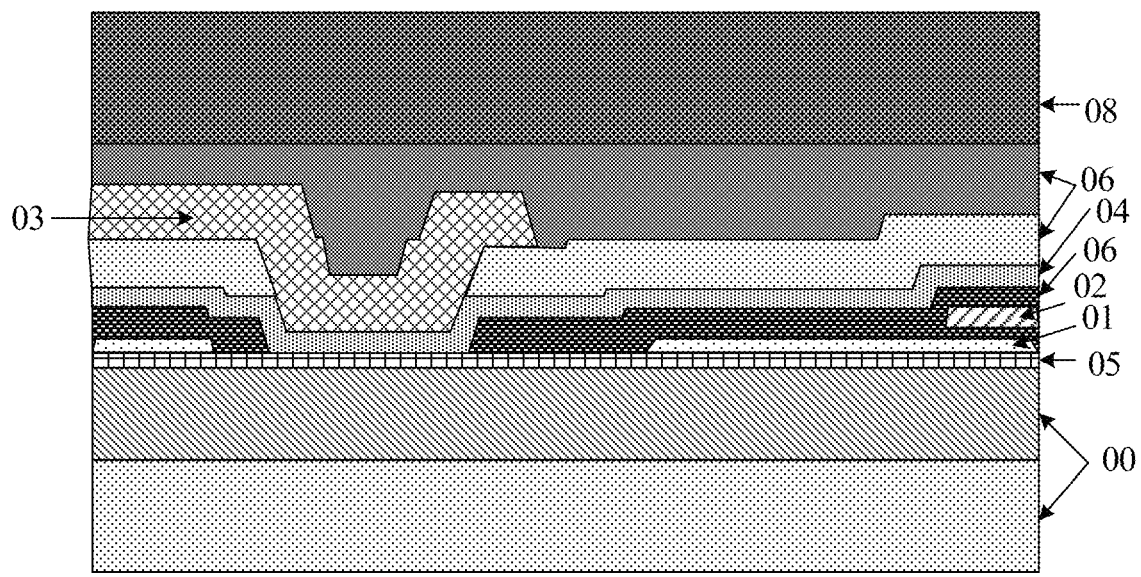
FIG. 13 is a sectional view in the direction of DD' in the structural diagram shown in FIG. 9.

Optionally, FIG. 9 shows a schematic diagram of a structure including a plurality of pixel circuits and a light-emitting element. FIG. 10 shows a sectional view in the direction AA' of the structure shown in FIG. 9. FIG. 11 shows a sectional view in the direction BB' in the structure shown in FIG. 9. FIG. 12 shows a sectional view in the direction CC' of the structure shown in FIG. 9. FIG. 13 shows a sectional view in the direction DD' of the structure shown in FIG. 9.

As may be seen with reference to FIGS. 9 to 13, the pixel circuit may include a base substrate 00, which may be a flexible substrate, and a buffer layer 05, a semiconductor layer 01, an insulating layer 06 (e.g., an inter-layer dielectric layer ILD), a first gate metal layer 02, an insulating layer 06 (e.g., an inter-layer dielectric layer ILD), a second gate metal layer 04 (e.g., an inter-layer dielectric layer ILD), an insulating layer 06, a source-drain metal layer 03, an insulating layer 06 (e.g., a planarization layer PLN), an anode 07 of the light-emitting element L1, and a pixel defining layer 08 which are laminated in sequence on a side of the base substrate 00.

As may be further seen in combination with FIGS. 9 and 10, the active layer 011d (i.e., the semiconductor layer 01 shown in the figures) of the second reset transistor T4 is relatively long. As may be further seen in combination with FIGS. 9 and 13, an orthographic projection of the coupled portion of the second gate metal layer 04 and the drive power line ELVDD on the base substrate 00 is not overlapped with an orthographic projection of the semiconductor layer 01 on the base substrate 00.

In summary, the embodiment of the present disclosure provides a pixel circuit. The semiconductor layer in the pixel circuit can form active layers of transistors, and a first gate metal layer in the pixel circuit can form gates of the transistors. The transistors include a first reset transistor for resetting the gate of the drive transistor, a second reset transistor for resetting the anode of the light-emitting element, and a first light emission control transistor coupled to the anode of the light-emitting element. In addition, the channel region of the first reset transistor is disposed between the channel region of the first light emission control transistor and the channel region of the second reset transistor. Accordingly, the distance between the second reset transistor and the anode of the light-emitting element is relatively large, such that the leakage path of the second reset transistor may be relatively long, and the leakage current may be relatively small. Therefore, the potential of the anode of the light-emitting element may be relatively stable, and the light-emitting effect of the light-emitting element is better, which can ensure a good display effect of the display panel.

Figure 14:
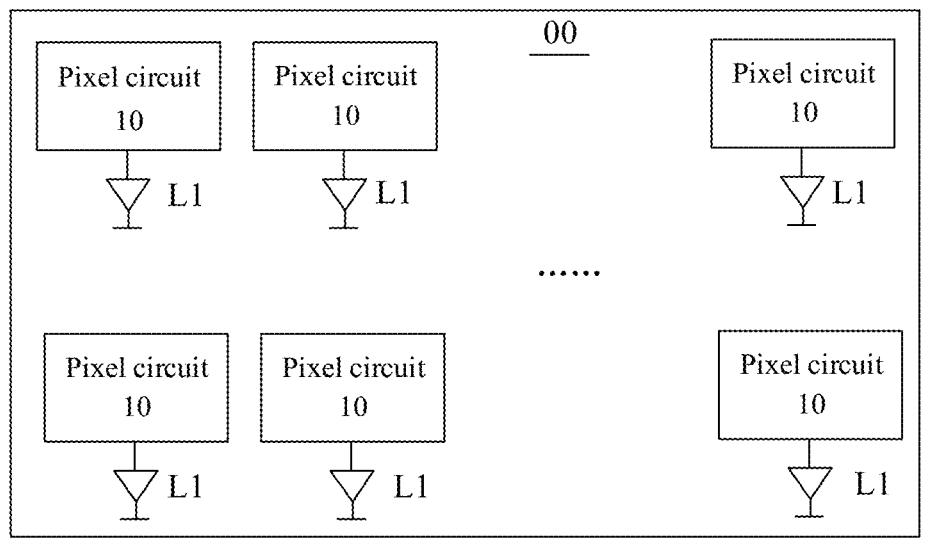
FIG. 14 is a schematic structural diagram of a display panel according to an embodiment of the present disclosure.

FIG. 14 is a schematic structural diagram of a display panel according to an embodiment of the present disclosure. As shown in FIG. 14, the display panel may include a base substrate 00, a light-emitting element L1 disposed on a side of the base substrate 00, and the pixel circuit 10 shown in the above figures. The pixel circuit 10 may be connected to the light-emitting element L1 (e.g., the anode of the light-emitting element L1). The pixel circuit 10 may be configured to drive the light-emitting element L1 to emit light.

Figure 15:
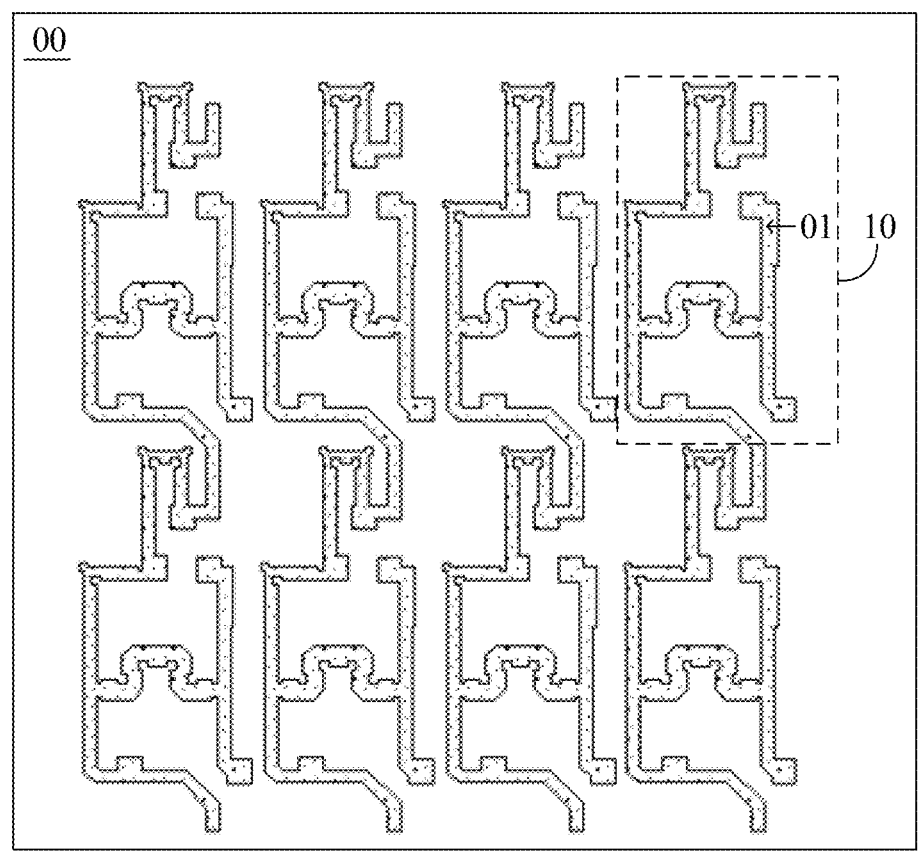
FIG. 15 is a structural layout of semiconductor layers of a plurality of pixel circuits according to an embodiment of the present disclosure.
Figure 16:
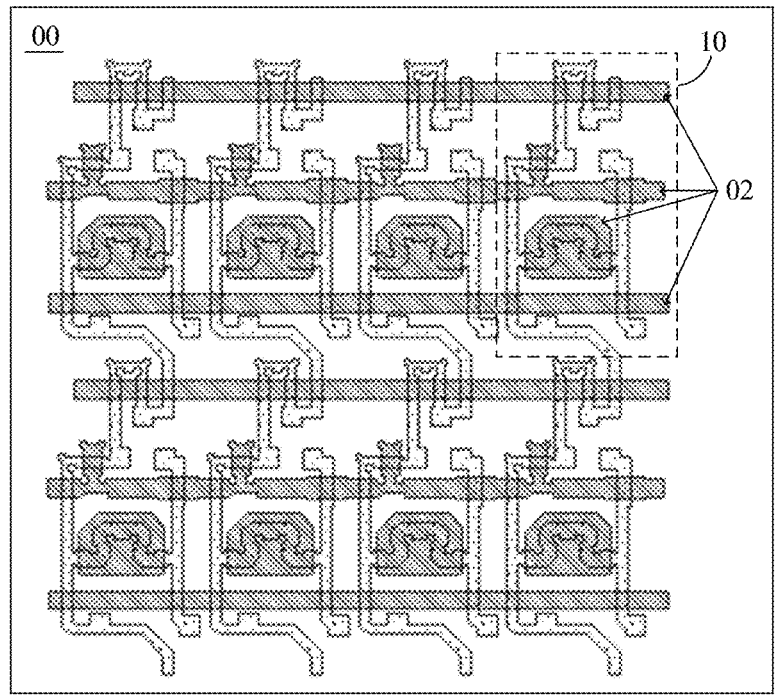
FIG. 16 is a structural layout of semiconductor layers and first gate metal layers of a plurality of pixel circuits according to an embodiment of the present disclosure.
Figure 17:
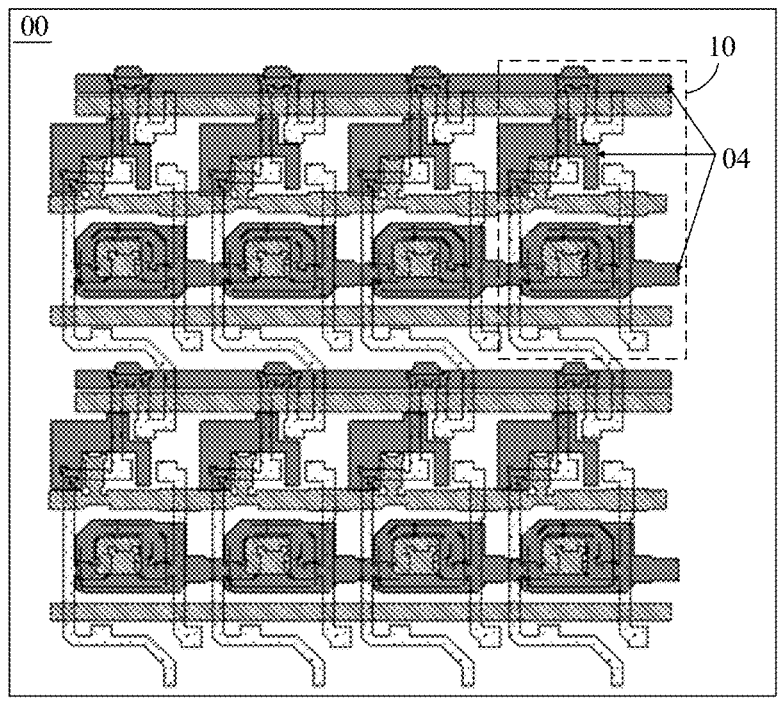
FIG. 17 is a structural layout of semiconductor layers, first gate metal layers, and second gate metal layers of a plurality of pixel circuits according to an embodiment of the present disclosure.
Figure 18:
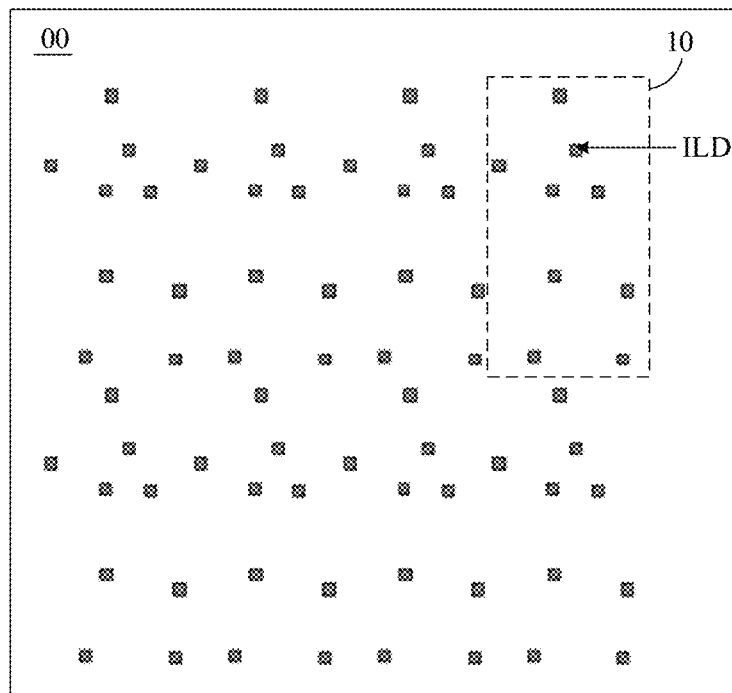
FIG. 18 is a structural layout of inter-layer dielectric layers of a plurality of pixel circuits according to an embodiment of the present disclosure.
Figure 19:
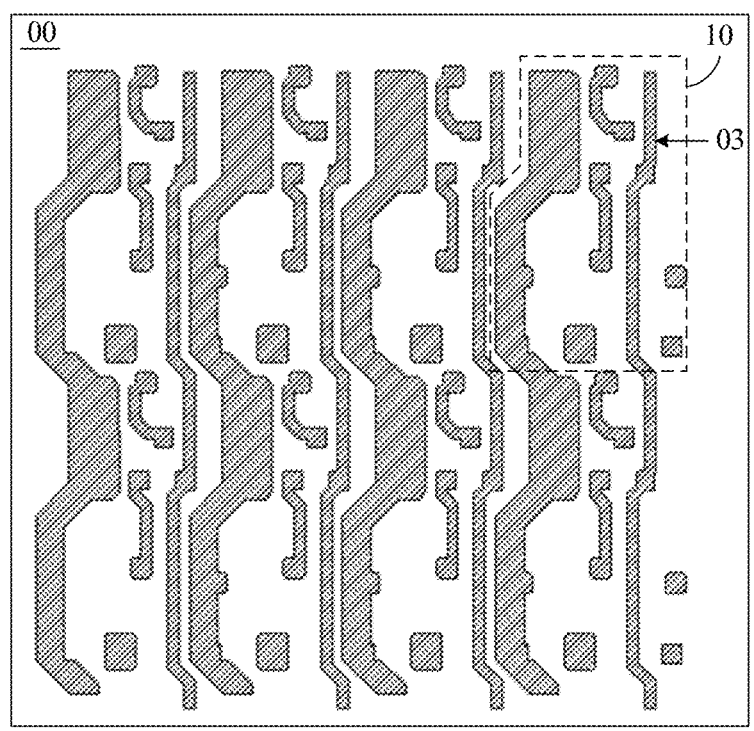
FIG. 19 is a structural layout of source-drain metal layers of a plurality of pixel circuits according to an embodiment of the present disclosure.
Figure 20:
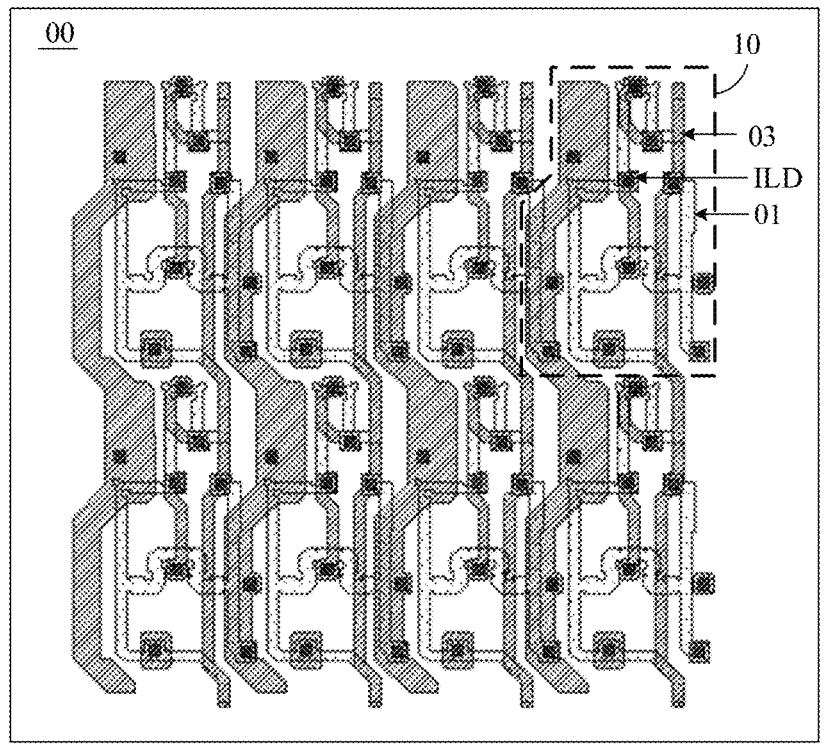
FIG. 20 is a structural layout of semiconductor layers, inter-layer dielectric layers, and source-drain metal layers of a plurality of pixel circuits according to an embodiment of the present disclosure.
Figure 21:
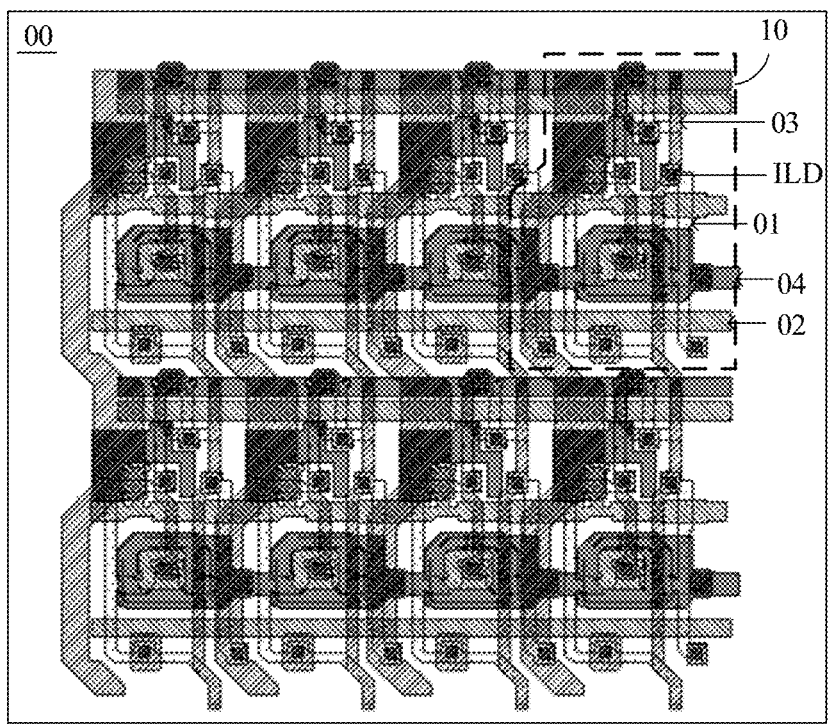
FIG. 21 is a structural layout of semiconductor layers, first gate metal layers, second gate metal layers, source-drain metal layers, and inter-layer dielectric layers of a plurality of pixel circuits according to an embodiment of the present disclosure.
Figure 22:
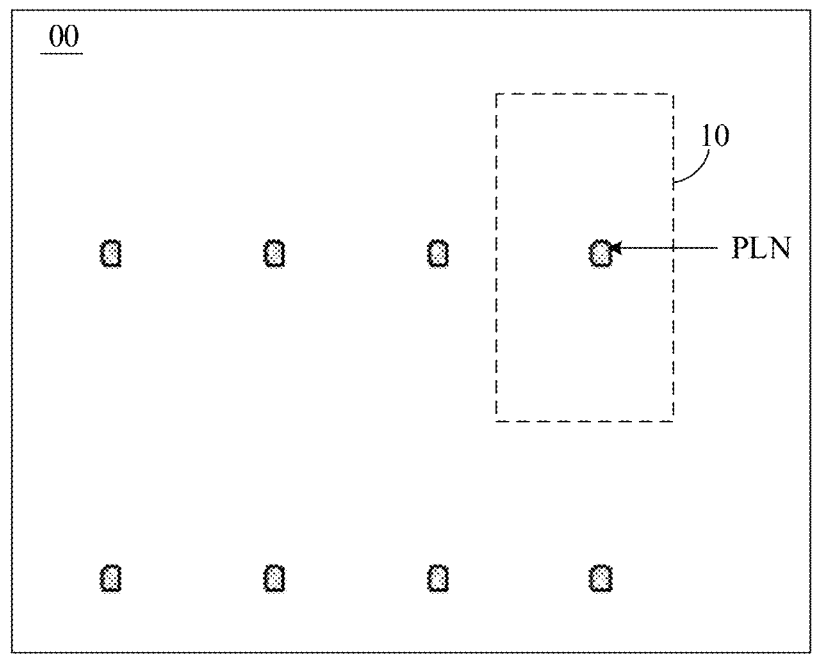
FIG. 22 is a structural layout of planarization layers of a plurality of pixel circuits according to an embodiment of the present disclosure.
Figure 23:
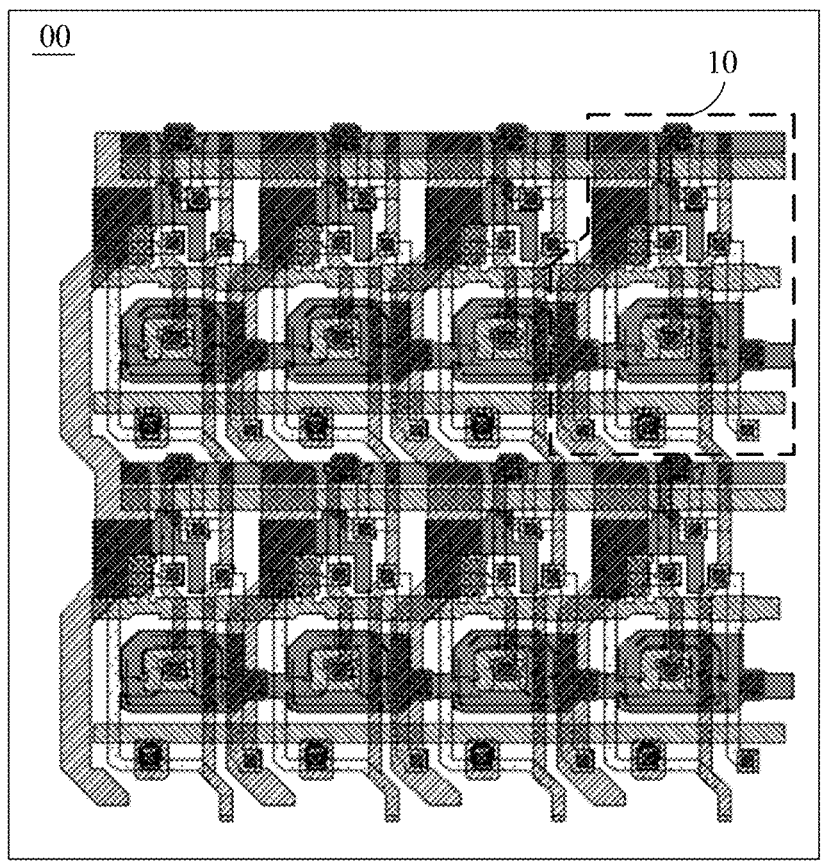
FIG. 23 is a structural layout of semiconductor layers, first gate metal layers, second gate metal layers, source-drain metal layers, inter-layer dielectric layers, and planarization layers of a plurality of pixel circuits according to an embodiment of the present disclosure.
Figure 24:
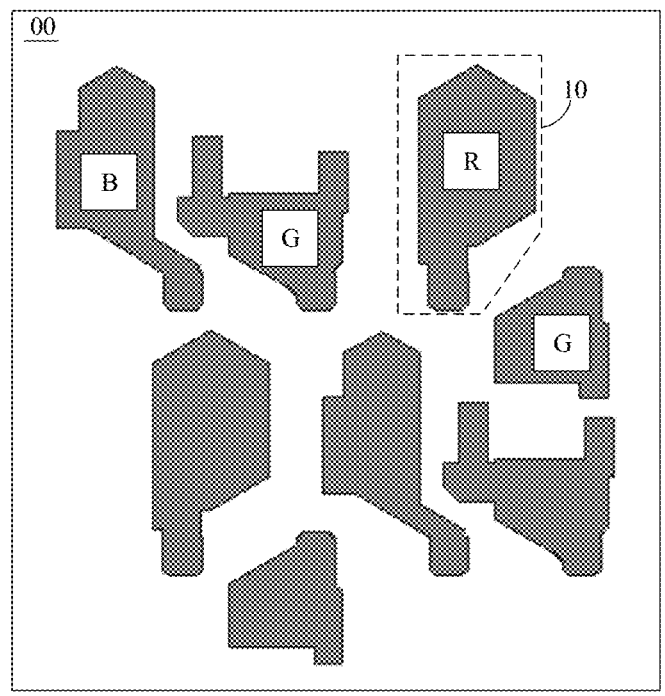
FIG. 24 is a structural layout of light-emitting elements of a plurality of pixel circuits according to an embodiment of the present disclosure.
Figure 25:
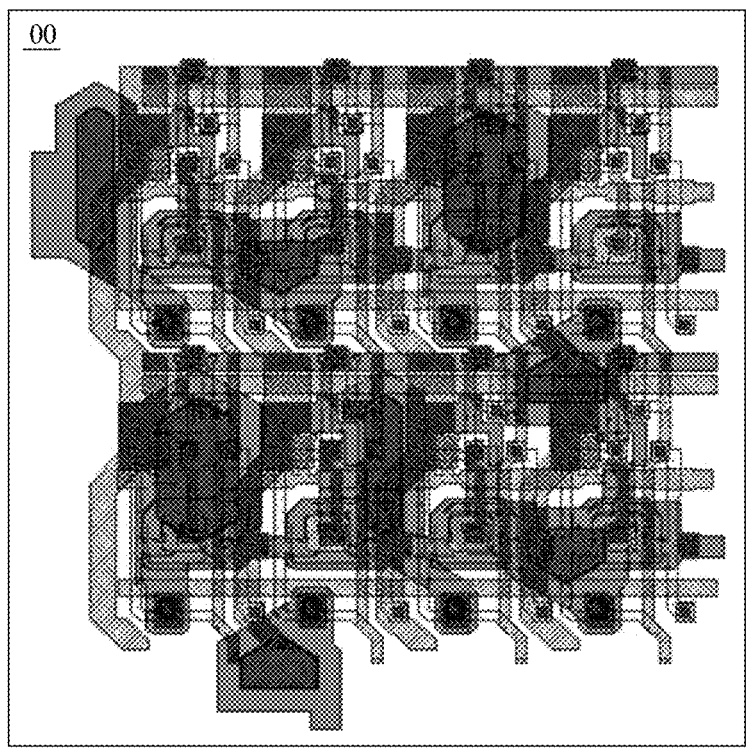
FIG. 25 is a complete layer structure layout of a plurality of pixel circuits according to an embodiment of the present disclosure.
Figure 26:
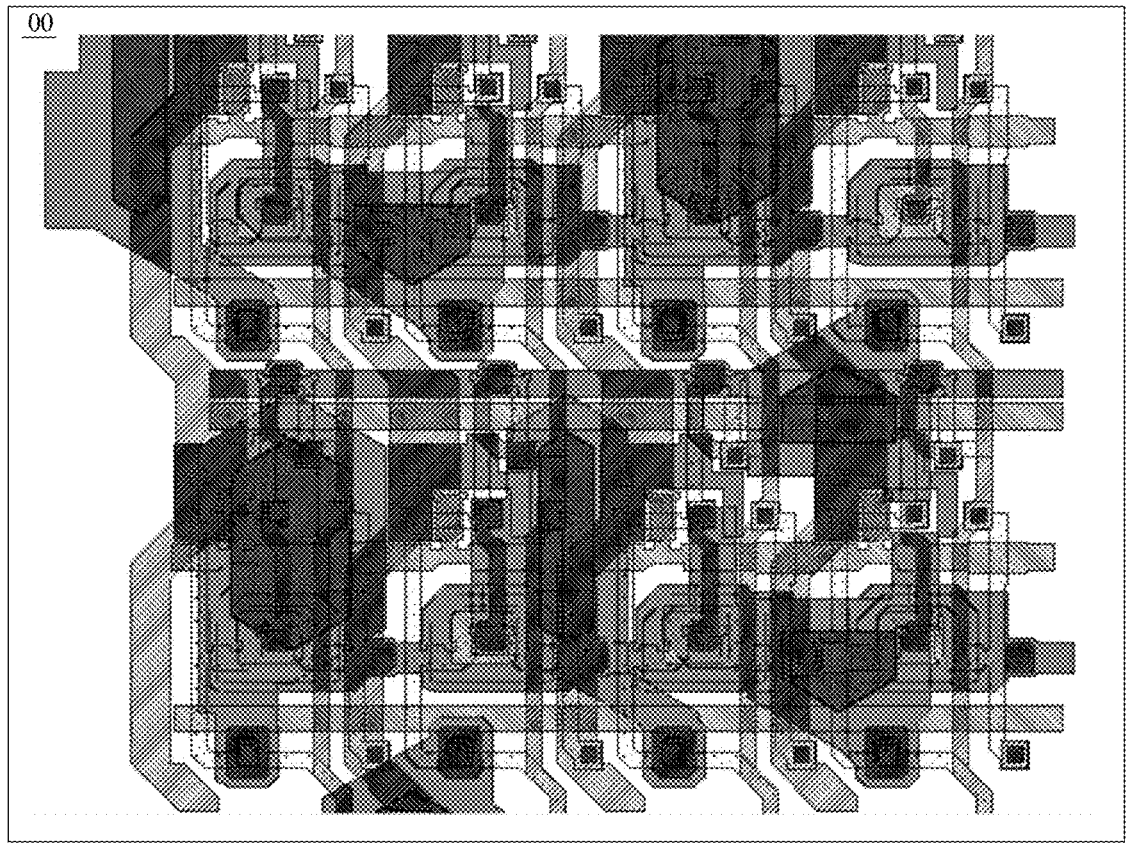
FIG. 26 is a partially enlarged view of the structure shown in FIG. 25.

Optionally, by taking an example in which a total of 2 rows of pixel circuits 10 are included and each row of pixel circuits 10 includes 4 pixel circuits 10 (i.e., 8 in total), FIG. 15 shows a structural layout of a display substrate including a semiconductor layer 01; FIG. 16 shows a structural layout of a display substrate including the semiconductor layer 01 and the first gate metal layer 02; FIG. 17 shows a structural layout of a display substrate including the semiconductor layer 01, the first gate metal layer 02, and the second gate metal layer 04; FIG. 18 shows a structural layout of a display substrate including the inter-layer dielectric layer ILD; FIG. 19 shows a structural layout of a display substrate including the source-drain metal layer 03; FIG. 20 shows a structural layout of a display substrate including the source-drain metal layer 03, the semiconductor layer 01, and the inter-layer dielectric layer ILD; FIG. 21 shows a structural layout of a display substrate including the first gate metal layer 02, the second gate metal layer 04, the semiconductor layer 01, the source-drain metal layer 03, and the inter-layer dielectric layer ILD; FIG. 22 shows a structural layout of a display substrate including the planarization layer PLN; FIG. 23 shows a structural layout of a display substrate including the first gate metal layer 02, the second gate metal layer 04, the semiconductor layer 01, the source-drain metal layer 03, the inter-layer dielectric layer ILD, and the planarization layer PLN; FIG. 24 shows a structural layout of a display substrate including the light-emitting element L1; FIG. 25 shows a complete layout of the display substrate including all structures; and FIG. 26 shows a partially enlarged view of the structure shown in FIG. 25.

As may be seen with reference to FIG. 17, in the embodiments of the present disclosure, in two adjacent pixel circuits 10 disposed in the same row, the third metal blocks 043 (i.e., the first capacitor electrodes C01) included in the second gate metal layers 04 are coupled to each other. In other words, the first capacitor electrode C01 is extended in the row direction.

In addition, as may be seen with reference to FIGS. 19 to 21, two adjacent pixel circuits disposed in the same column share the same data signal line DATA and the same drive power line ELVDD, and two adjacent pixel circuits disposed in the same row share the same reset signal line Vinit.

Optionally, as may be seen with reference to FIGS. 22 and 23, the pixel circuit described in the embodiments of the present disclosure may further include a planarization layer PLN disposed on the side of the source-drain metal layer 03 away from the base substrate 00. The anode of the light-emitting element L1 is disposed on the side of the planarization layer PLN away from the base substrate, and the anode of the light-emitting element L1 may be coupled to the source-drain metal layer 03 in the pixel circuit through a via hole penetrating the planarization layer PLN.

In addition, as may be seen with reference to FIG. 24, the display substrate may include a plurality of light-emitting elements L1 of different colors, such as red R, green G, and blue B. The plurality of light-emitting elements L1 of different colors may belong to the same pixel. For the structure shown in FIG. 24, each pixel includes two green light-emitting elements L1, one red light-emitting element L1, and one blue light-emitting element L1. Optionally, since the environments of the anode the two green light-emitting elements L1 are different, in order to maintain the consistency between the environment of the anode (i.e., the fourth node N4) of each light-emitting element L1 and the environment of the parasitic capacitance of the first node N1, it may be seen with reference to FIG. 24 that the shapes of the two green light-emitting elements L1 described in the embodiments of the present disclosure may be different.

Figure 27:
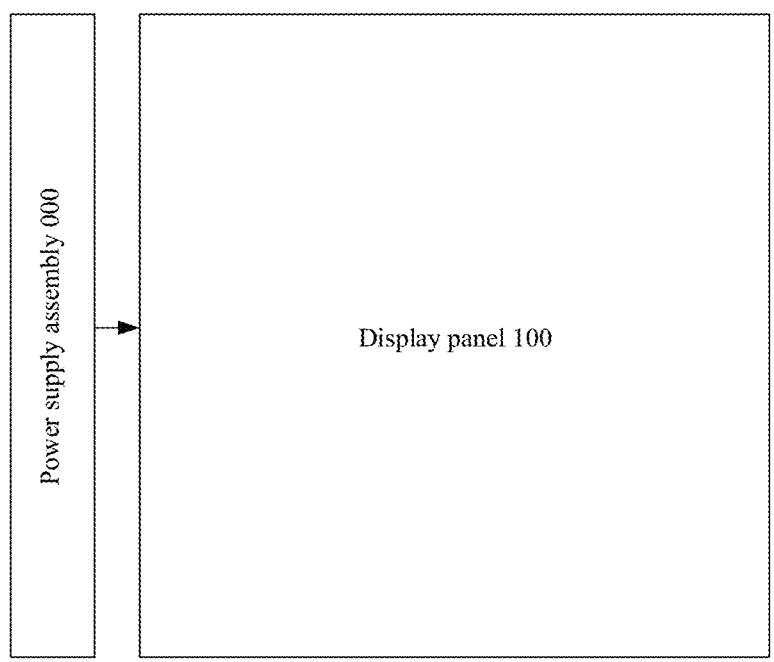
FIG. 27 is a schematic structural diagram of a display device according to an embodiment of the present disclosure.

FIG. 27 is a schematic structural diagram of a display device according to an embodiment of the present disclosure. As shown in FIG. 27, the display device may include a power supply assembly 000 and the display panel 100 shown in FIG. 14. The power supply assembly 000 may be coupled to the display panel 100 and may be configured to supply power to the display panel 100.

Optionally, the display device may be any product or component with a display function such as a liquid crystal panel, electronic paper, an organic light-emitting diode (OLED) panel, a mobile phone, a tablet computer, a television, a display, a notebook computer, a digital photo frame or a navigator.

It should be understood that the terms "first", "second" and the like in the description and claims of the embodiments of the present disclosure and the above drawings are intended to distinguish similar objects, and are not necessarily intended to describe a specific sequence or order. It should be understood that objects so used may be interchanged under appropriate circumstances, for example, they can be implemented in an order other than those presented in the drawings or descriptions of the embodiments of the present disclosure.

It should be understood that "and/or" mentioned herein refers to the existence of three kinds of relationships. For example, A and/or B may be expressed as: A exists alone, A and B exist concurrently, and B exists alone. The character "/" generally indicates that the associated objects are of an "or" relationship.

The descriptions above are merely optional embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A pixel circuit, comprising:
   a semiconductor layer disposed on a side of a base substrate, wherein the semiconductor layer is configured to form active layers of transistors in the pixel circuit, the active layer comprising a channel region, and a source region and a drain region disposed on two sides of the channel region; and
   a first gate metal layer disposed on the side of the base substrate, wherein the first gate metal layer is configured to form gates of the transistors, the gates of the transistors being arranged in sequence along a first direction, and the gate of each of the transistors being partially overlapped with the channel region;
   wherein in the transistors, a drain region of a first reset transistor is coupled to a gate of a drive transistor, a drain region of a second reset transistor is coupled to an anode of a light-emitting element, and a drain region of a first light emission control transistor is coupled to the anode of the light-emitting element; and along a second direction, a channel region of the first reset transistor is disposed between a channel region of the first light emission control transistor and a channel region of the second reset transistor, the first direction being perpendicular to the second direction.

2. The pixel circuit according to claim 1, wherein the channel region of the first reset transistor comprises a first channel region and a second channel region opposite to each other;
   wherein the channel region of the first light emission control transistor is close to the first channel region of the first reset transistor, and the channel region of the second reset transistor is close to the second channel region of the first reset transistor.

3. The pixel circuit according to claim 1, wherein a source region of the first reset transistor and a source region of the second reset transistor are both coupled to a reset signal line; and a gate of the first reset transistor and a gate of the second reset transistor are both coupled to a reset control line; and
   the drain region of the second reset transistor comprises a first strip portion and a second strip portion, the channel region of the second reset transistor is strip-shaped, and the source region of the second reset transistor is strip-shaped; wherein one end of the first strip portion is coupled to the anode of the light-emitting element; the other end of the first strip portion, the second strip portion, the channel region of the second reset transistor and one end of the source region of the second reset transistor are sequentially connected; and the other end of the source region of the second reset transistor is coupled to the reset signal line;

wherein the first strip portion and the second strip portion are not collinear, and/or the second strip portion and the channel region of the second reset transistor are not collinear.

4. The pixel circuit according to claim 3, wherein an angle between the first strip portion and the second strip portion and an angle between the second strip portion and the channel region of the second reset transistor are both obtuse angles, and both face towards the first reset transistor.

5. The pixel circuit according to claim 1, further comprising: a source-drain metal layer disposed on the side of the base substrate; wherein the source-drain metal layer is configured to form sources and drains of the transistors, wherein in each of the transistors, the source is coupled to the source region, and the drain is coupled to the drain region; and the source-drain metal layer is partially overlapped with the drain region of the first reset transistor and/or the channel region of the first reset transistor.

6. The pixel circuit according to claim 5, wherein the transistors further comprise a first data compensation transistor and a second data compensation transistor; wherein a drain region of the first data compensation transistor is coupled to a drain region of the drive transistor, and a source region of the first data compensation transistor is coupled to the gate of the drive transistor; a drain region of the second data compensation transistor is coupled to a source region of the drive transistor, a source region of the second data compensation transistor is coupled to a data signal line, and a gate of the first data compensation transistor and a gate of the second data compensation transistor are both coupled to a gate signal line; wherein the source-drain metal layer comprises a first metal pattern and a second metal pattern spaced apart from each other, the first metal pattern being partially overlapped with the drain region of the first reset transistor and/or the channel region of the first reset transistor, and the first reset transistor and the second reset transistor being coupled to a reset signal line through the first metal pattern; and the second metal pattern being partially overlapped with the drain region of the second data compensation transistor.

7. The pixel circuit according to claim 6, wherein the pixel circuit meets at least one of the following requirements:

the second metal pattern is further partially overlapped with a channel region of the second data compensation transistor and/or the drain region of the second data compensation transistor;

or the source-drain metal layer further comprises a third metal pattern and a fourth metal pattern spaced apart from each other; wherein the drain region of the first reset transistor and the gate of the drive transistor are coupled through the third metal pattern, and the drain region of the first data compensation transistor and the gate of the drive transistor are coupled through the third metal pattern; and the data signal line and the fourth metal pattern are disposed in a same layer.

8. The pixel circuit according to claim 6, wherein the transistors further comprise a second light emission control transistor; wherein a gate of the second light emission control transistor and a gate of the first light emission control transistor are both coupled to a light emission control line; a drain region of the second light emission control transistor is coupled to the source region of the drive transistor, and a source region of the second light emission control transistor is coupled to a drive power line; and a source region of the first light emission control transistor is coupled to the drain region of the drive transistor;

wherein the drive power line and the second metal pattern are disposed in a same layer.

9. The pixel circuit according to claim 1, further comprising: a second gate metal layer disposed on the side of the base substrate, wherein the second gate metal layer comprises a first metal block, the first metal block being partially overlapped with the drain region of the first reset transistor.

10. The pixel circuit according to claim 9, wherein the second gate metal layer further comprises a second metal block spaced apart from the first metal block;

wherein the second metal block is partially overlapped with the active layer of the first reset transistor, and is partially overlapped with the drain region of the second reset transistor.

11. The pixel circuit according to claim 10, wherein the pixel circuit meets at least one of the following requirements:

the reset signal line coupled to the first reset transistor and the second reset transistor is disposed in a same layer as the second metal block;

or the second metal block comprises a first portion extending along the first direction and a second portion extending along the second direction.

12. The pixel circuit according to claim 9, wherein the second gate metal layer further comprises a third metal block spaced apart from the first metal block;

wherein the third metal block is configured to form a first capacitor electrode of a storage capacitor, and the first gate metal layer is further configured to form a second capacitor electrode of the storage capacitor, the first capacitor electrode being partially overlapped with the second capacitor electrode.

13. The pixel circuit according to claim 12, wherein the third metal block is coupled to a drive power line, and a portion, coupled to the drive power line, of the third metal block is not overlapped with the active layer.

14. The pixel circuit according to claim 9, wherein the first metal block is further partially overlapped with the drain region of the first data compensation transistor.

15. The pixel circuit according to claim 14, wherein the first metal block comprises a first metal strip, a second metal strip, and a third metal strip connected in sequence; wherein the first metal strip is partially overlapped with the drain region of the first data compensation transistor, the second metal strip is partially overlapped with the drain region of the first reset transistor, and the third metal strip is disposed between a first node and a second node;

wherein the first node is a node at which the gate of the drive transistor is coupled to the drain region of the first reset transistor, and the second node is a node at which the drain region of the second data compensation transistor is coupled to a data signal line.

16. The pixel circuit according to claim 15, wherein an extending direction of the second metal strip intersects an extending direction of the first metal strip and intersects an extending direction of the third metal strip, and the extending direction of the first metal strip is parallel to the extending direction of the third metal strip.

17. The pixel circuit according to claim 16, wherein the extending direction of the second metal strip is perpendicular to the extending direction of the first metal strip, and is perpendicular to the extending direction of the third metal strip.

18. A display panel, comprising: a base substrate, a light-emitting element disposed on a side of the base substrate, and the pixel circuit according to claim 1;
   wherein the pixel circuit is connected to the light-emitting element, and the pixel circuit is configured to drive the light-emitting element to emit light.

19. The display panel according to claim 18, wherein the display panel meets at least one of the following requirements:
   the pixel circuit further comprises a planarization layer disposed on a side, away from the base substrate, of a source-drain metal layer, an anode of the light-emitting element is disposed on a side, away from the base substrate, of the planarization layer, and the anode of the light-emitting element is coupled to the source-drain metal layer in the pixel circuit through a via hole penetrating the planarization layer;
   or
   in two adjacent pixel circuits in a same row, third metal blocks in second gate metal layers are coupled to each other; two adjacent pixel circuits in a same column share a same data signal line and a same drive power line; and two adjacent pixel circuits in the same row share a same reset signal line.

20. A display device, comprising: a power supply assembly, and the display panel according to claim 18;
   wherein the power supply assembly is connected to the display panel, and configured to supply power to the display panel.

* * * * *